United States Patent
Lee et al.

(10) Patent No.: US 10,833,172 B2
(45) Date of Patent: Nov. 10, 2020

(54) GATE STACK RELIABILITY IN VERTICAL TRANSPORT FIELD EFFECT TRANSISTORS

(71) Applicant: International Business Machines Corporation, Armonk, NY (US)

(72) Inventors: Choonghyun Lee, Albany, NY (US); Christopher J. Waskiewicz, Albany, NY (US); Miaomiao Wang, Albany, NY (US); Hemanth Jagannathan, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/104,230

(22) Filed: Aug. 17, 2018

(65) Prior Publication Data

US 2020/0058766 A1 Feb. 20, 2020

(51) Int. Cl.
*H01L 29/788* (2006.01)
*H01L 29/66* (2006.01)
(Continued)

(52) U.S. Cl.
CPC .. *H01L 29/66666* (2013.01); *H01L 21/28114* (2013.01); *H01L 21/31116* (2013.01); *H01L 29/0653* (2013.01); *H01L 29/42368* (2013.01); *H01L 29/42376* (2013.01); *H01L 29/513* (2013.01); *H01L 21/26513* (2013.01); *H01L 21/28185* (2013.01); *H01L 21/28194* (2013.01); *H01L 21/28202* (2013.01); *H01L 21/28211* (2013.01); *H01L 21/31138* (2013.01); *H01L 21/32134* (2013.01); *H01L 21/823885* (2013.01); *H01L 29/0847* (2013.01); *H01L 29/517* (2013.01)

(58) Field of Classification Search
CPC ......... H01L 21/28088; H01L 21/28114; H01L 21/31116; H01L 21/3215; H01L 21/823814; H01L 27/092; H01L 29/0653; H01L 29/0847; H01L 29/41791; H01L 29/42368; H01L 29/42376; H01L 29/4983; H01L 29/513; H01L 29/66666; H01L 29/7827
USPC .......................................... 257/329; 438/149
See application file for complete search history.

(56) References Cited

U.S. PATENT DOCUMENTS 8,698,199 B2 * 4/2014 Chen ................. H01L 29/66787
257/192
9,299,835 B1 3/2016 Anderson et al.
(Continued)

*Primary Examiner* — Brook Kebede
(74) *Attorney, Agent, or Firm* — Fleit Intellectual Property Law; Thomas S. Grzesik

(57) ABSTRACT

A semiconductor structure and a method for fabricating the same. The semiconductor structure includes at least one semiconductor fin. A first source/drain contacts the semiconductor fin. An interfacial layer contacts sidewalls of the semiconductor fin. An insulating layer contacts the interfacial layer. One or more conductive gate layers encapsulate the interfacial and insulating layers. A second source/drain is formed above the first source/drain. The method comprises forming at least one semiconductor fin. An interfacial layer is formed in contact with sidewalls of the semiconductor fin. An insulating layer is formed in contact with the interfacial layer. The interfacial layer and the insulating layer are encapsulated by one or more conductive gate layers.

20 Claims, 19 Drawing Sheets

(51) Int. Cl.
*H01L 29/51* (2006.01)
*H01L 29/06* (2006.01)
*H01L 29/423* (2006.01)
*H01L 21/28* (2006.01)
*H01L 21/311* (2006.01)
H01L 21/8238 (2006.01)
H01L 29/08 (2006.01)
H01L 21/265 (2006.01)
H01L 21/3213 (2006.01)

(56) References Cited

U.S. PATENT DOCUMENTS

| | | |
|---|---|---|
| 9,437,503 B1 | 9/2016 | Mallela et al. |
| 9,761,491 B1 | 9/2017 | Huang et al. |
| 9,773,708 B1 | 9/2017 | Zhang et al. |
| 9,806,173 B2 | 10/2017 | Balakrishnan et al. |
| 9,837,553 B1 | 12/2017 | Wu et al. |
| 9,972,700 B2 | 5/2018 | Cheng et al. |
| 2015/0372149 A1 | 12/2015 | Colinge et al. |
| 2017/0256539 A1* | 9/2017 | Tsai .................. H01L 27/0886 |
| 2017/0288030 A1 | 10/2017 | Cheng et al. |
| 2017/0373167 A1 | 12/2017 | Bergendahl et al. |

* cited by examiner

GATE STACK RELIABILITY IN VERTICAL TRANSPORT FIELD EFFECT TRANSISTORS

BACKGROUND OF THE INVENTION

The present disclosure generally relates to the field of semiconductors, and more particularly relates to vertical transport field effect transistors.

Vertical field effect transistors (VFETs) are becoming viable device options for semiconductor devices, for example, complementary metal oxide semiconductor (CMOS) devices, beyond 5 nanometer (nm) node. VFET devices include fin channels with source/drain regions at ends of the fin channels on top and bottom sides of the fins. Current runs through the fin channels in a vertical direction (e.g., perpendicular to a substrate), for example, from a bottom source/drain region to a top source/drain region. Vertical transport architecture devices are designed to extend the product value proposition beyond conventional plateaus and address the limitations of horizontal device architectures by, for example, decoupling of gate length from the contact gate pitch. Vertical transistors may provide higher density scaling and allow for relaxed gate lengths to better control device electrostatics, without sacrificing the gate contact pitch size.

SUMMARY OF THE INVENTION

In one embodiment, a method for forming a semiconductor structure is disclosed. The method comprises at least the following operations. At least one semiconductor fin is formed. An interfacial layer is formed in contact with sidewalls of the semiconductor fin. An insulating layer is formed in contact with the interfacial layer. The interfacial layer and the insulating layer are encapsulated by one or more conductive gate layers.

In another embodiment, a semiconductor structure is disclosed. The semiconductor structure comprises at least the following components. A first source/drain in contact with at least one semiconductor fin. An interfacial layer in contact with at least sidewalls of the semiconductor fin. An insulating layer in contact with at least the interfacial layer. One or more conductive gate layers encapsulating the interfacial and insulating layers. A second source/drain formed above the first source/drain. An integrated circuit may comprise the above semiconductor structure.

In a further embodiment, another semiconductor structure is disclosed. The semiconductor structure comprises at least the following components. A first source/drain in contact with at least one semiconductor fin. An interfacial layer in contact with at least sidewalls of the semiconductor fin. An insulating layer in contact with at least the interfacial layer. One or more conductive gate layers encapsulating the interfacial and insulating layers. A protective layer in contact with and extending above at least the one or more conductive gate layers. A second source/drain formed above the first source/drain and in contact with at least inner sidewalls of the protective layer. An integrated circuit may comprise the above semiconductor structure.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
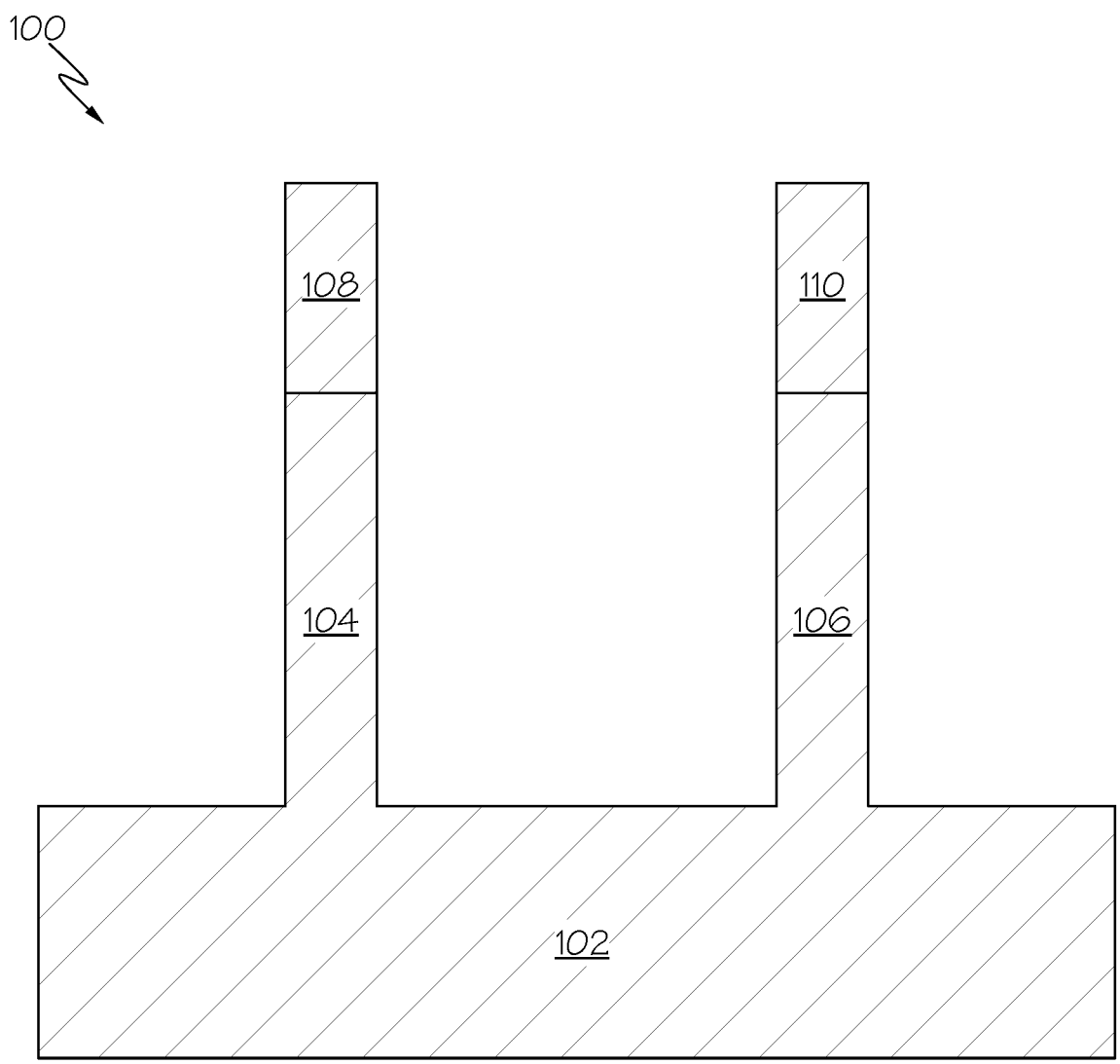
FIG. 1 is a cross-sectional view of a semiconductor structure after a plurality of fin structures have been formed on a substrate according one embodiment of the present disclosure.

Vertical transistors may provide higher density scaling and allow for relaxed gate lengths to better control device electrostatics, without sacrificing the gate contact pitch size. However, with ever decreasing device dimensions, forming the individual components and electrical contacts become more difficult. Conventional VFETs suffer from the poor reliability of gate stack due to the damage of interfacial layer and high-k at the channel during the gate recess process, resulting in the generation of shallow trap sites in the interfacial layer and high-k layers.

Embodiments of the present invention overcome the above problems by fabricating vertical transport FETs with an encapsulating high-k insulating layer, which improves gate stack reliability. In addition, the fabrication process resolves the risk of high-k exposure post high-temperature gate stack anneal.

It is to be understood that the present disclosure will be described in terms of a given illustrative architecture; however, other architectures, structures, substrate materials and process features and steps may be varied within the scope of the present disclosure.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present disclosure may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Referring now to the drawings in which like numerals represent the same or similar elements, FIG. 1 shows a semiconductor structure 100 at a given point in the fabrication process. For example, FIG. 1 shows a substrate 102; a plurality of fin structures 104, 106; and a hard mask 108, 110 formed on and in contact with a top surface of each fin structure 104, 106. In some embodiments, the substrate 102 is a bulk substrate. The structure 100 may comprise fins 104, 160 for PFET devices, NFET devices, or a combination of both. In one embodiment, the substrate 102 comprises entirely of a semiconductor material. The substrate 102 may comprise a single crystalline semiconductor material or a polycrystalline material. In another embodiment, the substrate 102 may include an elemental semiconductor material such as silicon (Si) or germanium (Ge), a semiconductor material primarily composed of Group IV elements such as a silicon-germanium alloy or a silicon-carbon alloy, a III-V compound semiconductor material, a II-VI compound semiconductor material, or an organic semiconductor material.

The substrate 102 may comprise undoped single crystalline silicon or single crystalline silicon doped with p-type dopant atoms or n-type dopant atoms. Examples of materials for the substrate 102 include, but are not limited to, silicon, germanium, diamond, silicon germanium, silicon carbide, gallium arsenic, indium arsenide, indium phosphide, silicon germanium carbide, gallium arsenic phosphide, gallium indium phosphide, combinations of these, or any other suitable semiconductor material(s) in which fins for multigate devices can be formed. In other embodiments, the substrate 102 is formed on and in contact with a handle substrate or an insulating layer disposed in contact with a handle substrate. In this embodiment, the handle substrate includes similar materials to those discussed above.

Doping of the substrate 102 (or other semiconductor layer from which the fins 104 106 are formed) may be performed using, for example, ion implantation, or annealing if not using an epitaxial process. In a non-limiting illustrative example, the doping utilizes, for example, arsenic (As) or phosphorous (P) for n-type device, and boron (B) for a p-type device, at concentrations in the general range of, for example, e20/cm$^3$.

In other embodiments, the substrate 102 is a silicon-on-insulator (SOI) substrate. In this example, an optional dielectric layer (e.g., a BOX layer or oxide layer) overlies the substrate, and the fin structures 104, 106 are formed on and in contact with the dielectric layer. The optional dielectric layer may be formed from any of several dielectric materials. Non-limiting examples include, for example, oxides, nitrides and oxynitrides of silicon. The dielectric layer may also include oxides, nitrides and oxynitrides of elements other than silicon. In addition, the dielectric layer may include crystalline or non-crystalline dielectric material. Moreover, the dielectric layer may be formed using any of several methods. Non-limiting examples include ion implantation methods, thermal or plasma oxidation or nitridation methods, chemical vapor deposition methods and physical vapor deposition methods. The dielectric layer may include a thickness ranging from about 5 nm to about 200 nm. In one embodiment, the dielectric layer may be about 25 nm thick. In an embodiment where the fins structures are formed on an SOI substrate, the fin structures and the substrate can be made of the same or different materials.

In an SOI embodiment, the semiconductor material/layer from which the fin structures 104, 106 are fabricated may be formed utilizing various methods such as a layer transfer process including a bonding step, or an implantation process such as SIMOX (Separation by IMplantation of OXygen). This semiconductor material/layer nay be undoped or doped with either p-type or n-type dopants through ion implantation, plasma doping, or gas phase doping. P-type transistors are produced by doping the semiconductor material/layer with elements from group III of the periodic table (e.g., boron, aluminum, gallium, or indium). As an example, the dopant can be boron in a concentration ranging from 1×10E18 atoms/cm3 to 2×10E21 atoms/cm3. N-type transistors are produced by doping the semiconductor material/layer with elements from group V of the periodic table (e.g., phosphorus, antimony, or arsenic).

The fin structures 104, 106 may be formed by forming an etch-stop hard mask onto the substrate 102 (or semiconductor layer) through, for example, deposition. The etch-stop hard mask may be made of, for example, silicon oxide, silicon oxynitride, silicon carbide, silicon oxycarbide, silicon nitride, titanium nitride, tetraethyl orthosilicate, a combination thereof, and/or other materials suitable in providing etch-stop function. The fin structures 104, 106 are subsequently formed or etched out of the substrate 102 (or the semiconductor layer) through a process involving masking, using industry-standard lithographic techniques, and directionally etching (e.g., RIE) the etch-stop capping layer and underneath semiconductor layer (or substrate 102). After the RIE etching process, the photo-resist mask used in the lithographic etching process may be removed, leaving the fin structures 104, 106 and hard masks 108, 110. In some embodiments, there may be different pitches between two or more of the fin structures to define different devices.

Figure 2:
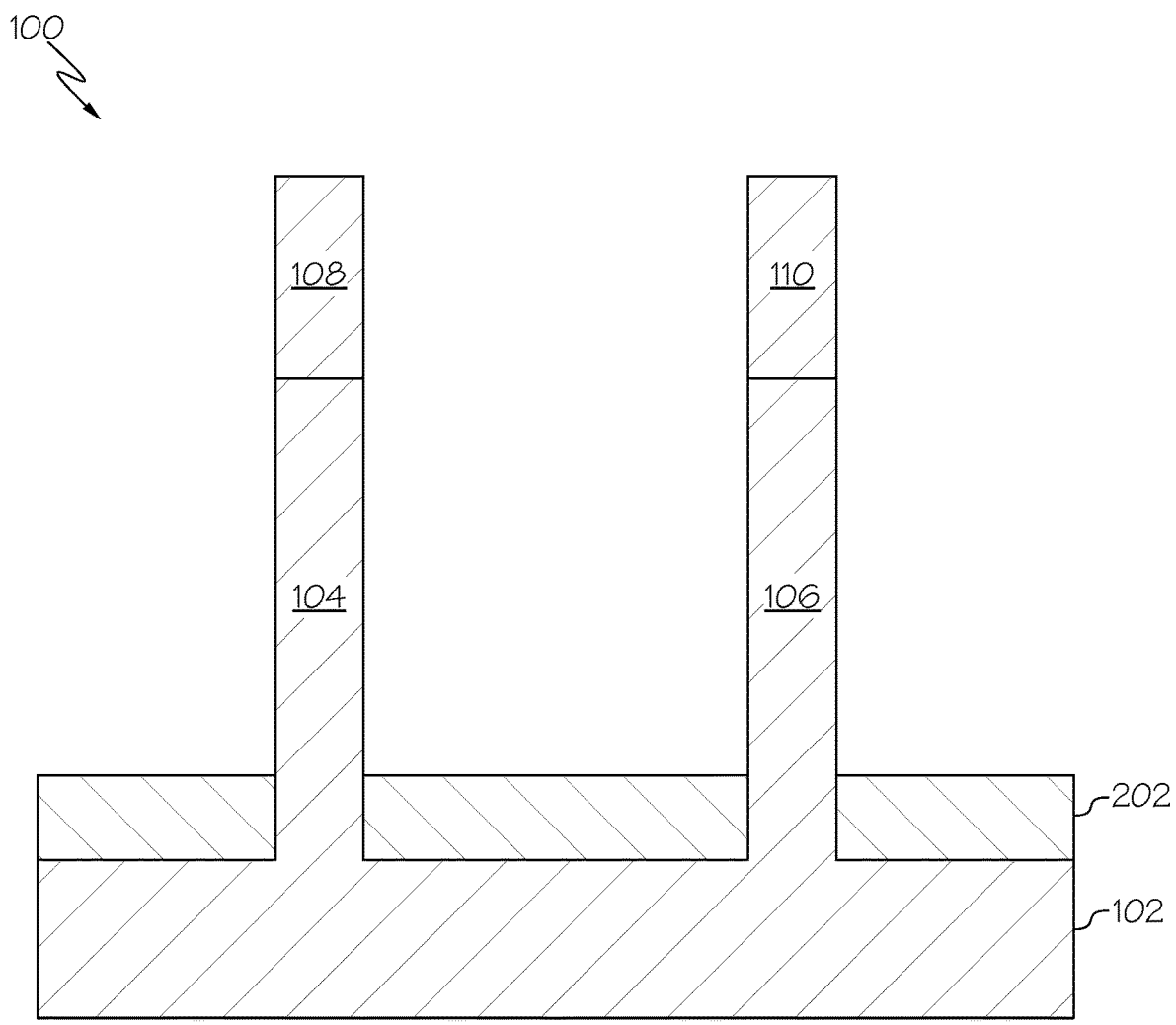
FIG. 2 is a cross-sectional view of the semiconductor structure after a bottom source/drain layer has been formed according one embodiment of the present disclosure.

A bottom source/drain layer 202 is then formed, as shown in FIG. 2. The bottom source/drain layer 202 may either be a source layer or a drain layer. In one embodiment a liner is formed on the sidewalls of the fins 104, 106 prior to forming the bottom source/drain layer 202. For example, a material such as silicon nitride or silicon oxide may be formed over the structure. Then, a spacer RIE is performed to remove the liner material from the structure with the exception of the fin sidewalls. The substrate 102 is then recessed using, for example, directional RIE. The bottom source/drain layer 202 is then formed in contact with a top surface of the substrate 102 and bottom portions of the fin sidewalls. The liner may then be removed.

Example materials for the bottom source/drain layer 202 include (but are not limited to) phosphorus doped silicon epitaxy for an NFET device and boron doped silicon germanium epitaxy for a PFET device. In one embodiment, the bottom source/drain layer 202 may have a thickness of about 10 nm to about 100 nm. However, other thicknesses are applicable as well. The bottom source/drain layer 202 may be doped with dopant atoms. The dopant atoms may be an n-type dopant (i.e., an element from Group V of the Periodic Table of Elements) or a p-type dopant (i.e., an element from Group III of the Periodic Table of Elements). Exemplary n-type dopants for a group IV semiconductor include phosphorus, arsenic and antimony. Exemplary p-type dopants for a group IV semiconductor include boron, aluminum, and gallium. Exemplary n-type dopants for a III-V semiconductor include selenium, tellurium, silicon, and germanium. Exemplary p-type dopants for a III-V semiconductor include beryllium, zinc, cadmium, silicon, and germanium.

In some embodiments, the bottom source/drain layer 202 is formed by epitaxial growth of a semiconductor material. The terms "epitaxially growing", "epitaxial growth", "epitaxially grown", and their variants mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatus that are suitable for use in one or more embodiments include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). A number of different sources can be used for the deposition of the various layers discussed herein. For example, the gas source for the deposition of epitaxial semiconductor material can include a silicon containing gas source, a germanium containing gas source, a carbon containing gas source, or a combination thereof. Examples of silicon containing gas sources are silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane, and combinations thereof. Examples of germanium containing gas sources are germane, digermane, halogermane, dichlorogermane, trichlorogermane, tetrachlorogermane and combinations thereof.

Figure 3:
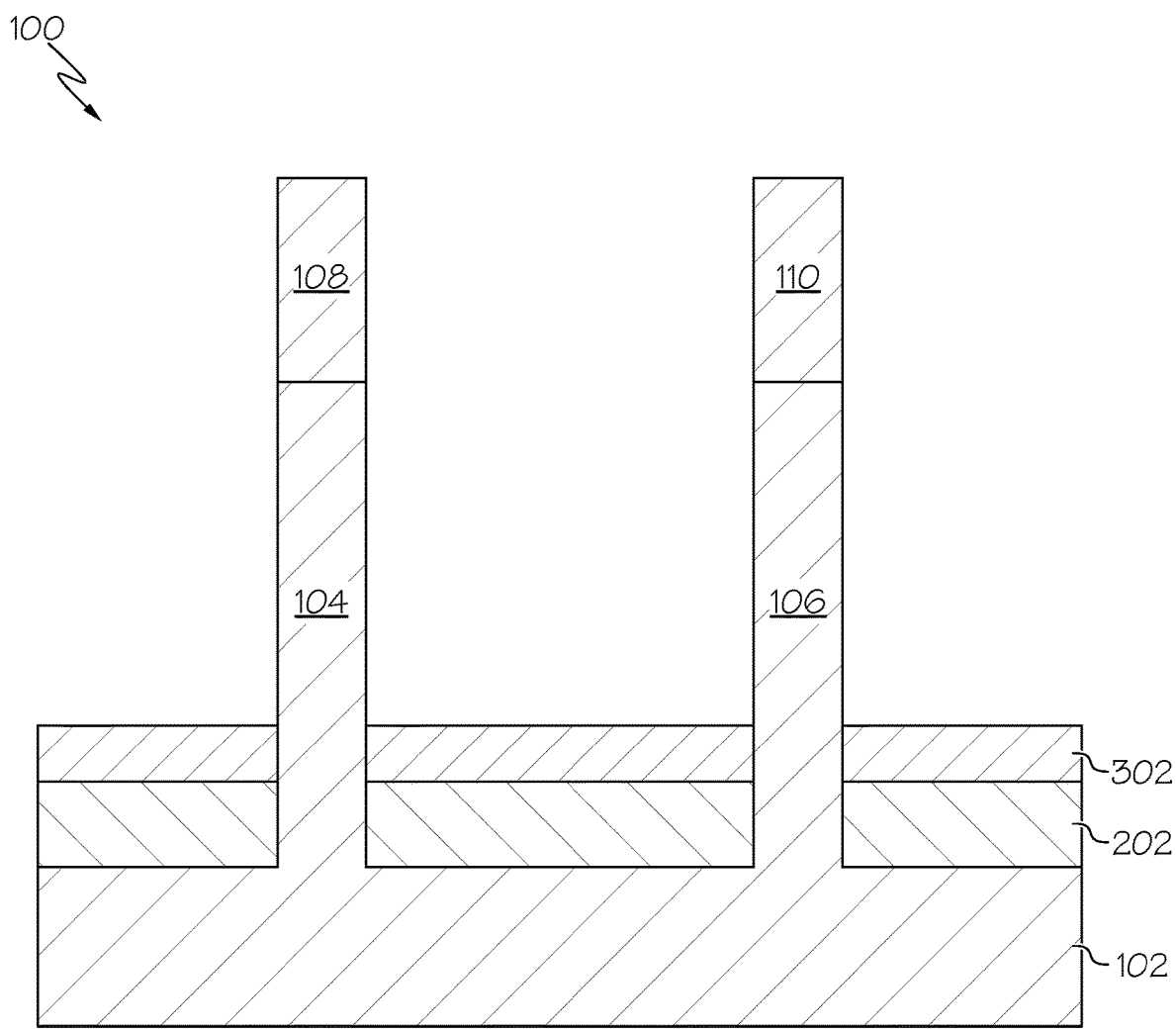
FIG. 3 is a cross-sectional view of the semiconductor structure after a bottom spacer layer has been formed according one embodiment of the present disclosure.

A bottom spacer layer 302 is then formed in contact with each of the fin structures 104, 106, as shown in FIG. 3. The bottom spacer layer 302 contacts a top surface of the bottom source/drain layer 202, and a portion of the sidewalls of the fin structures 104, 106. In one embodiment, the bottom spacer layer(s) 302 may include an insulating material (such as silicon oxide, silicon nitride, silicon oxynitride, or a combination of these) and is formed using any non-conformal deposition process such as, for example, high density plasma (HDP) and physical vapor deposition (PVD) and subsequent etching techniques. The deposited spacer material may then be subsequently etched to form the final spacer structure. In one embodiment, the bottom spacer layer 302 has a thickness of, for example, 3 nm to 30 nm.

Figure 4:
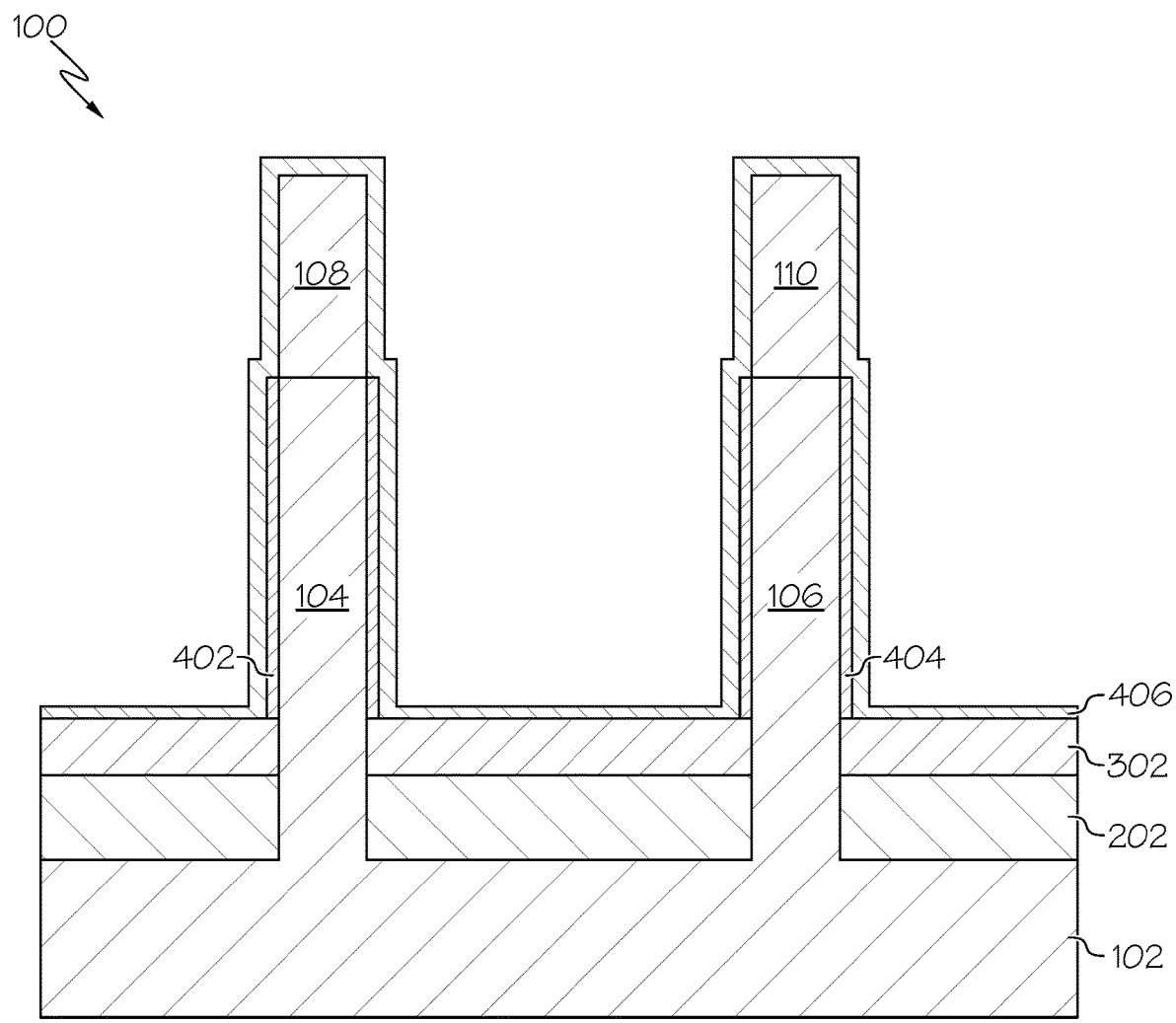
FIG. 4 is a cross-sectional view of the semiconductor structure after an interfacial layer and insulating layer have been formed according one embodiment of the present disclosure.

An interfacial layer 402, 404 is formed on sidewalls of each fin structure 104, 106 followed by the formation of an insulating layer 406 over the structure, as shown in FIG. 4. In one embodiment, the interfacial layers 402, 404 comprise, for example, silicon oxide, silicon nitride, silicon oxynitride and may be formed by chemical oxidation, low temperature oxidation, nitridation, and/or oxynitridation process. The insulating layer 406 is formed by depositing a thin conformal layer over the structure by, for example, CVD, PECVD, or ALD. In one embodiment, the insulating layer 406 may be a high-k dielectric layer. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The insulating layer 406 may further include dopants such as lanthanum or aluminum.

Figure 5:
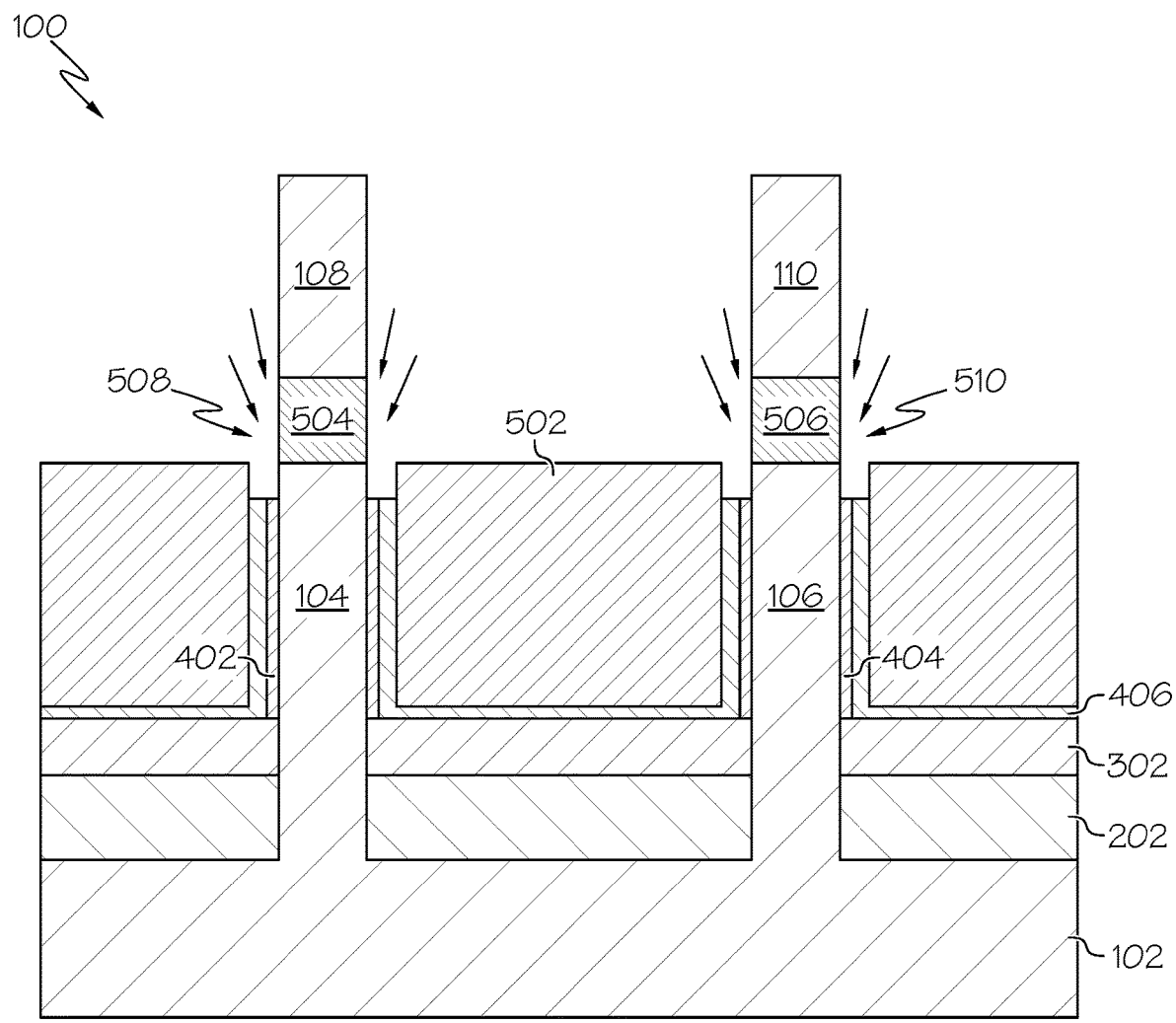
FIG. 5 is a cross-sectional view of the semiconductor structure after the interfacial and insulating layers have been recessed and top source/drain junctions have been formed according one embodiment of the present disclosure.

After formation of the interfacial layers 402, 404 and insulating layer 406, an organic planarization layer (OPL) 502 may be formed over the structure by, for example, spin coating, spray, CVD, evaporation, and/or the like. The OPL 502 is the recessed below a top surface of the fin structure 104, 106 as shown in FIG. 5. RIE or another etching process may be used to etch the interfacial layers 402, 404 and insulating layer 406 such that the top surface of these layers is below the top surface of the OPL 502. An implantation process is then performed to form top source/drain junctions 504, 506 within a portion 508, 510 of the fin structures 104, 106 exposed by etching the interfacial layers 402, 404 and insulating layer 406. The source/drain junctions 504, 506 reduce access series resistance. In some embodiments, the implantation process utilizes the same dopant or species as the bottom source/drain 202. The concentration of may be, for example, in the range of range of 1e19/cm3 to 1e20/cm3 although other concentrations are applicable as well. The dimensions (e.g., thickness) of the interfacial layers 402, 404 and insulating layer 406 prevent the dopants from being implanted into the open area below the top surface of the OPL 502. In some embodiments, the junctions 504, 506 may have a height of, for example, 4 nm to 10 nm Although other dimensions are applicable as well. The junctions 504, 506 may extend down to the interfacial layers 402, 404, but may stop above the interfacial layers 402, 404 in other embodiments.

Figure 6:
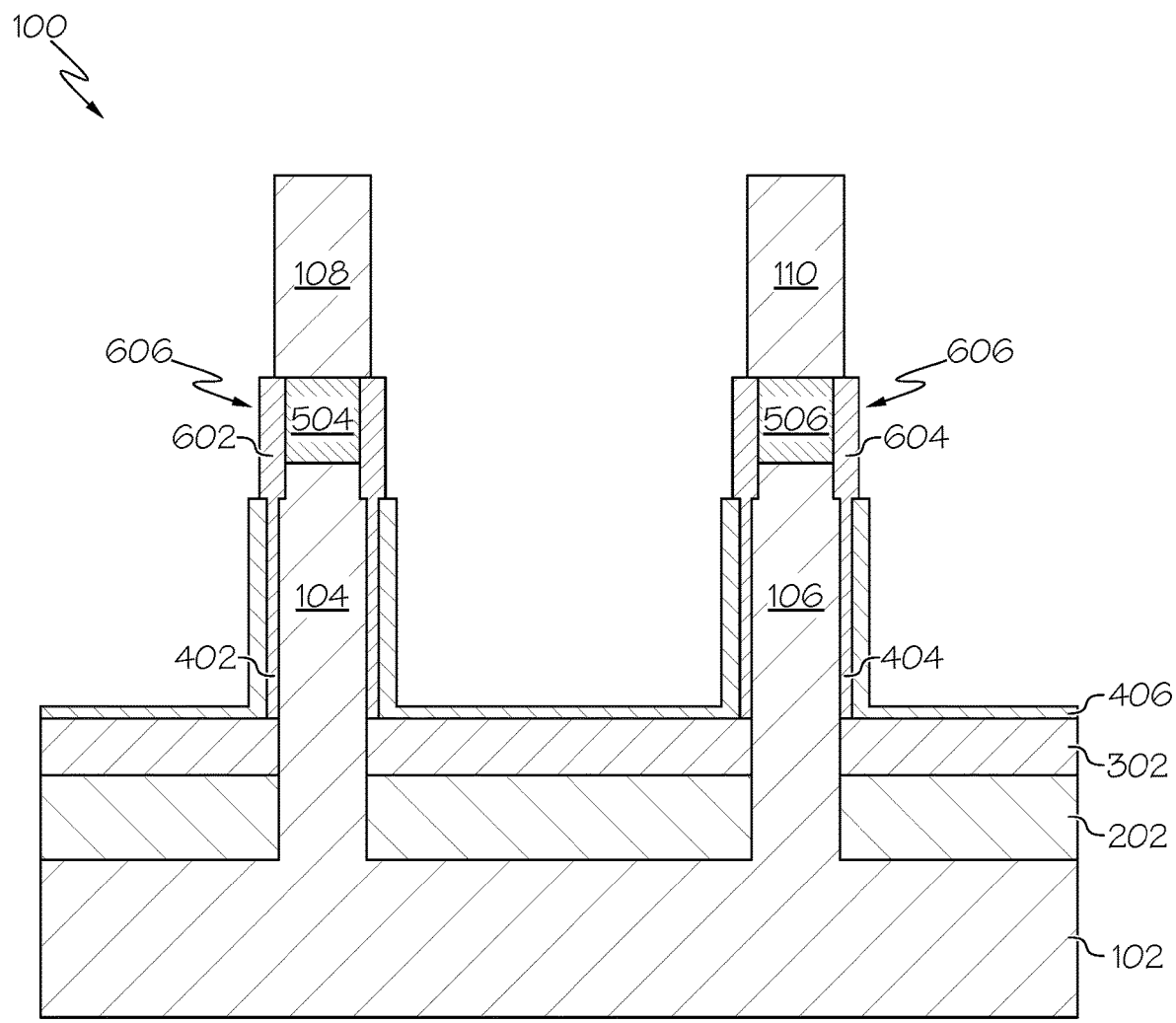
FIG. 6 is a cross-sectional view of the semiconductor structure after oxide layers have been formed according one embodiment of the present disclosure.
Figure 12:
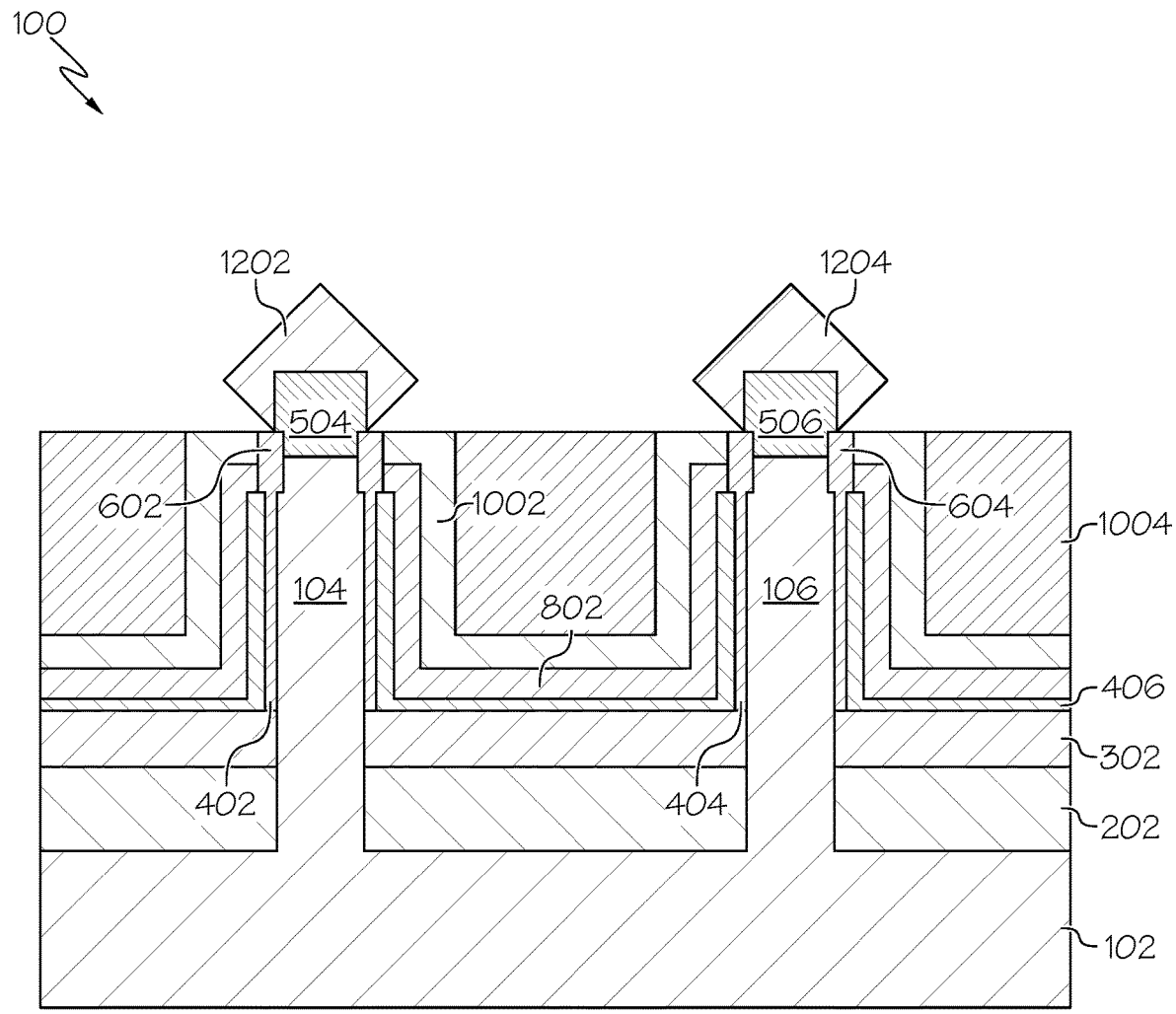
FIG. 12 is a cross-sectional view of the semiconductor structure after top source/drain layers have been formed according one embodiment of the present disclosure.

The OPL 502 is then removed using, for example, nitrogen or hydrogen plasma, as shown in FIG. 6. A chemical oxide layer 602, 604 is then formed in contact with exposed portions 606, 608 of the fin structures 104, 106 and the top source/drain junctions 504,506. The chemical oxide layers 602, 604 may comprise, for example, SiO2, SiON, and/or the like. The chemical oxide layer 602, 604 may be formed in contact with the top surface of the interfacial layer 402, 404 and the top surface of the insulating layer 406. The chemical oxidation process consumes part of the exposed portion of portions 606, 608 of the fin structures 104, 106 and the top source/drain junctions 504, 506. Therefore, the chemical oxide layers 602, 604 are wider/thicker than the interfacial layers 402, 404 and the portion of the fin structures 104, 106 surrounded by the interfacial layers 402, 404 and insulating layer 406 is wider than the exposed portion of portions 606, 608 of the fin structures 104, 106 and the top source/drain junctions 504, 506. The thicker chemical oxide layers 602, 604 prevent shorting between subsequently formed gate conductive layers 802 (FIG. 8) and a top source/drain 1202 (FIG. 12).

Figure 7:
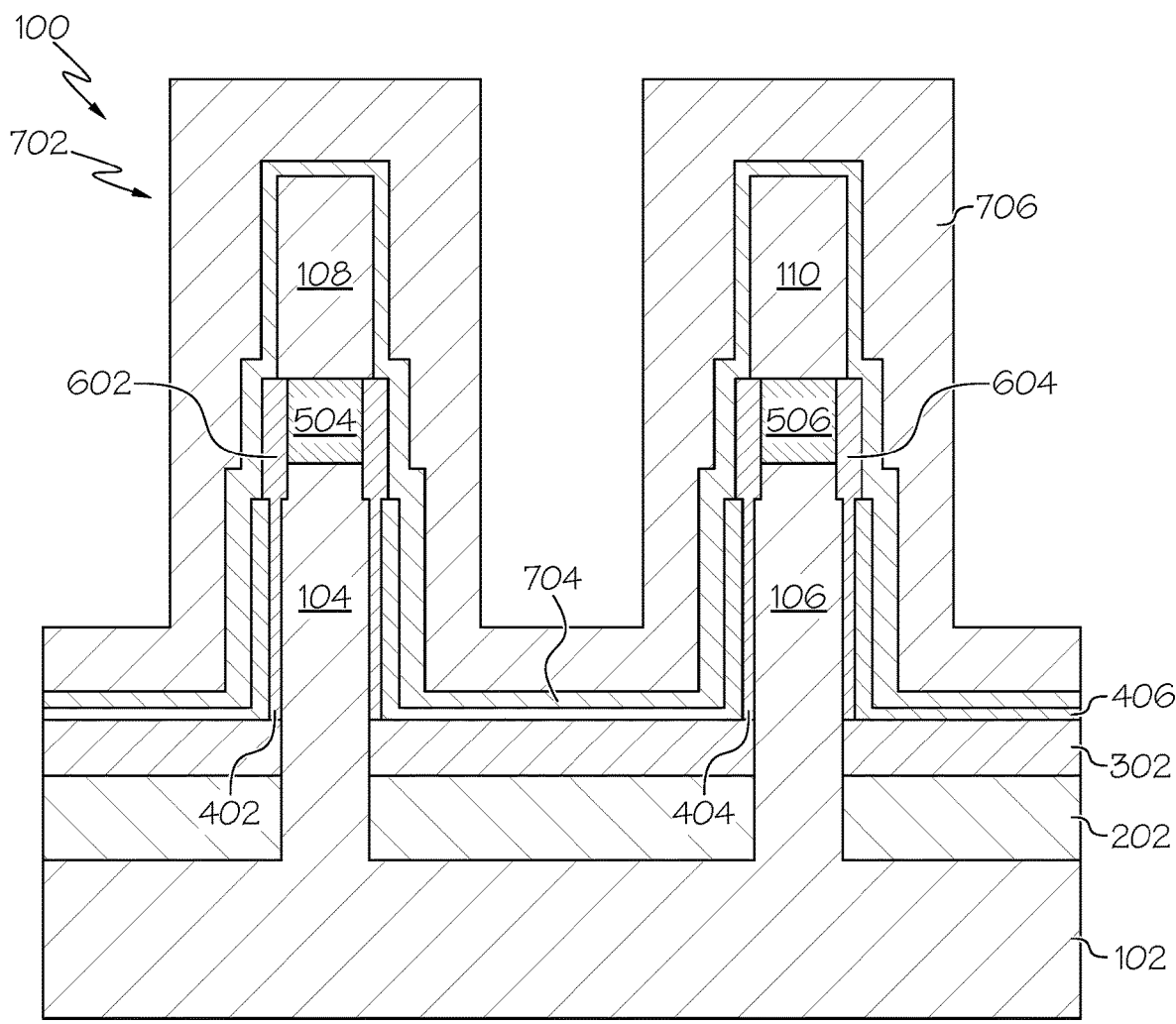
FIG. 7 is a cross-sectional view of the semiconductor structure after an oxygen blocking layer has been formed over the structure and an anneal has been performed according one embodiment of the present disclosure.

After formation of the chemical oxide layers 602, 604, an oxygen blocking layer 702 is formed over the structure as shown in FIG. 7. The oxygen blocking layer 702 may comprise a first layer 704 formed in contact with a top surface of horizontal portions of the insulating layer 406; sidewalls (vertical portions) of the insulating layer 406; sidewalls and the top surface of the chemical oxide layers 602, 604; and sidewalls and the top surface of the hard mask 108. In one embodiment, the first layer 704 may be formed by CVD, PECVD, ALD, and/or the like. The first layer 704 may comprise, for example, TiN and may have a thickness of 1 nm to 3 nm although other thicknesses are applicable as well.

The oxygen blocking layer 702 may also comprise a second layer 706 formed in contact with the top surfaces of the horizontal portions of the first layer 704 and the sidewalls (vertical portions) of the first layer 704. In one embodiment, the second layer 706 may be formed by CVD, PECVD, ALD, and/or the like. The second layer 706 may comprise, for example, a-Si and may have a thickness that is greater than the first layer 704. After the oxygen blocking layer 702 has been formed, a high-temperature anneal (e.g., 800C to 1077C) is performed to densify the interfacial layers 402, 404 and the insulating layer 406 at the same time. The oxygen blocking layer 702 allows for high-temperature anneal in a limited oxygen ambient, which helps improve the gate stack reliability by densifying the interfacial layer and high-k layer. Also, atomic arrangement of Si—O—Si bonds in the interfacial layer and Hf—O bonds in the insulating layer occurs.

Figure 8:
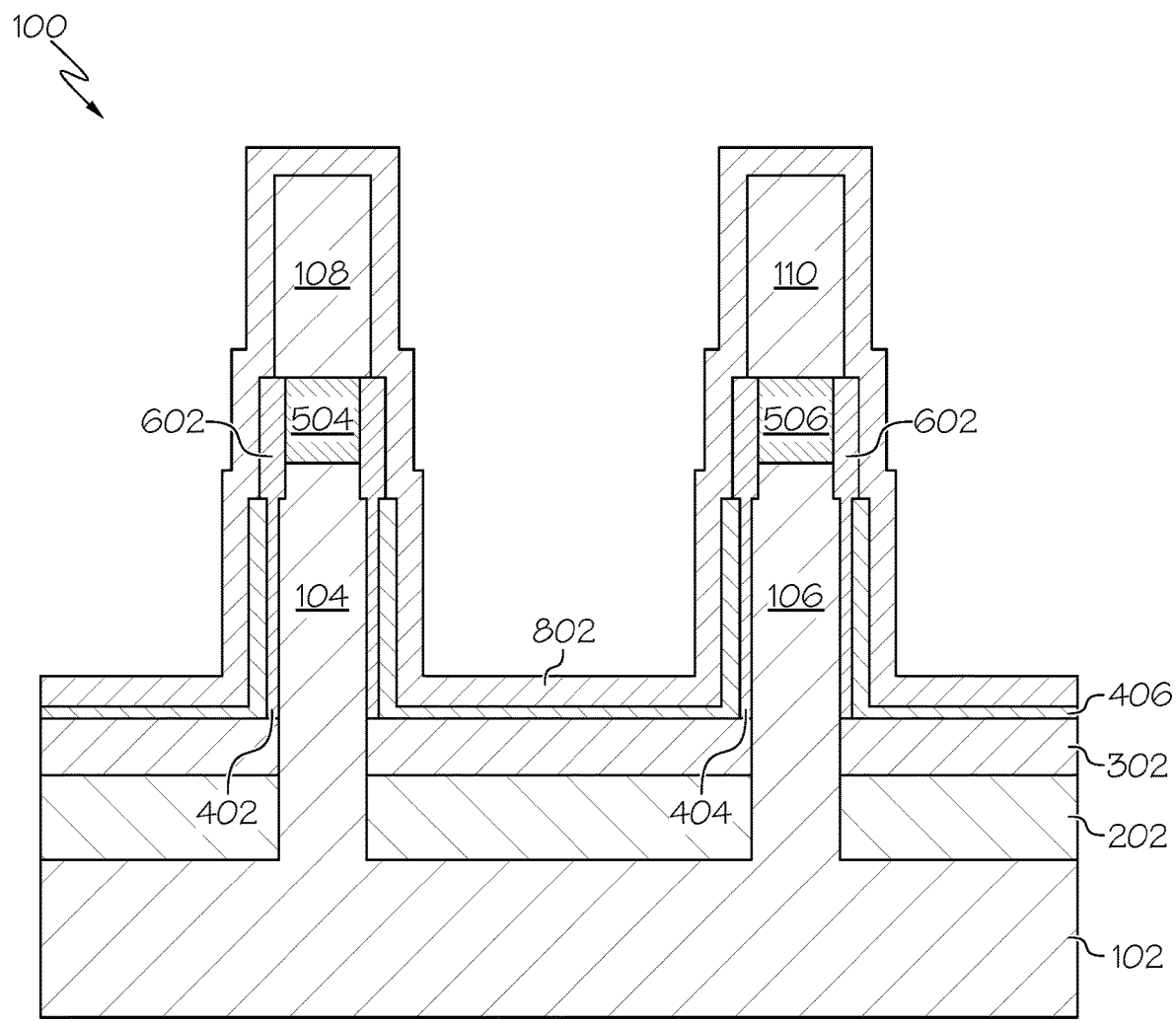
FIG. 8 is a cross-sectional view of the semiconductor structure after one or more conductive gate layers have been formed over the structure according one embodiment of the present disclosure.

After the anneal has been performed, the oxygen blocking layer 702 is removed and one or more conductive gate layers 802 may be formed as shown in FIG. 8. The oxygen blocking layer 702 may be removed by selective we etch and dry etch against dielectric materials. Thus, the etching process automatically stops on dielectric layers (e.g., insulating layer 406; hard mask 108; 110; oxide layers 602, 604; etc. In one embodiment, the conductive gate layers are formed by depositing one or more conductive materials over the structure with the first conductive layer contacting a top surface of horizontal portions of the insulating layer 406; sidewalls (vertical portions) of the insulating layer 406; sidewalls and the top surface of the chemical oxide layers 602, 604; and sidewalls and the top surface of the hard mask 108. If the structure comprises both PFET and NFET devices, PFET conductive materials may first be deposited. The PFET device may then masked off and one or more NFET conductive materials are deposited over the entire structure. The masking layer is then removed from the PFET device. In other embodiments, the NFET device may be masked off during deposition of the PFET gate layers.

Examples of conductive gate materials include (but are not limited to) polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive gate material may further comprise dopants that are incorporated during or after deposition.

The conductive gate material may comprise multiple layers such as gate work function setting layer (work function metal) and/or a conductive gate layer. The work function metal be deposited employing CVD, sputtering, or plating. The work function metal layers may comprise one or more metals having a function suitable to tune the work function of NFETs or PFETs. In various embodiments, a work function layer may be a conductive nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a conductive carbide, including but not limited to titanium carbide (TiC), titanium aluminum carbide (TiAlC), tantalum carbide (TaC), hafnium carbide (HfC); or combinations thereof. The work function layer may include multiple layers of work function materials, for example, a work function layer can be a TiN/TiC stack.

Figure 9:
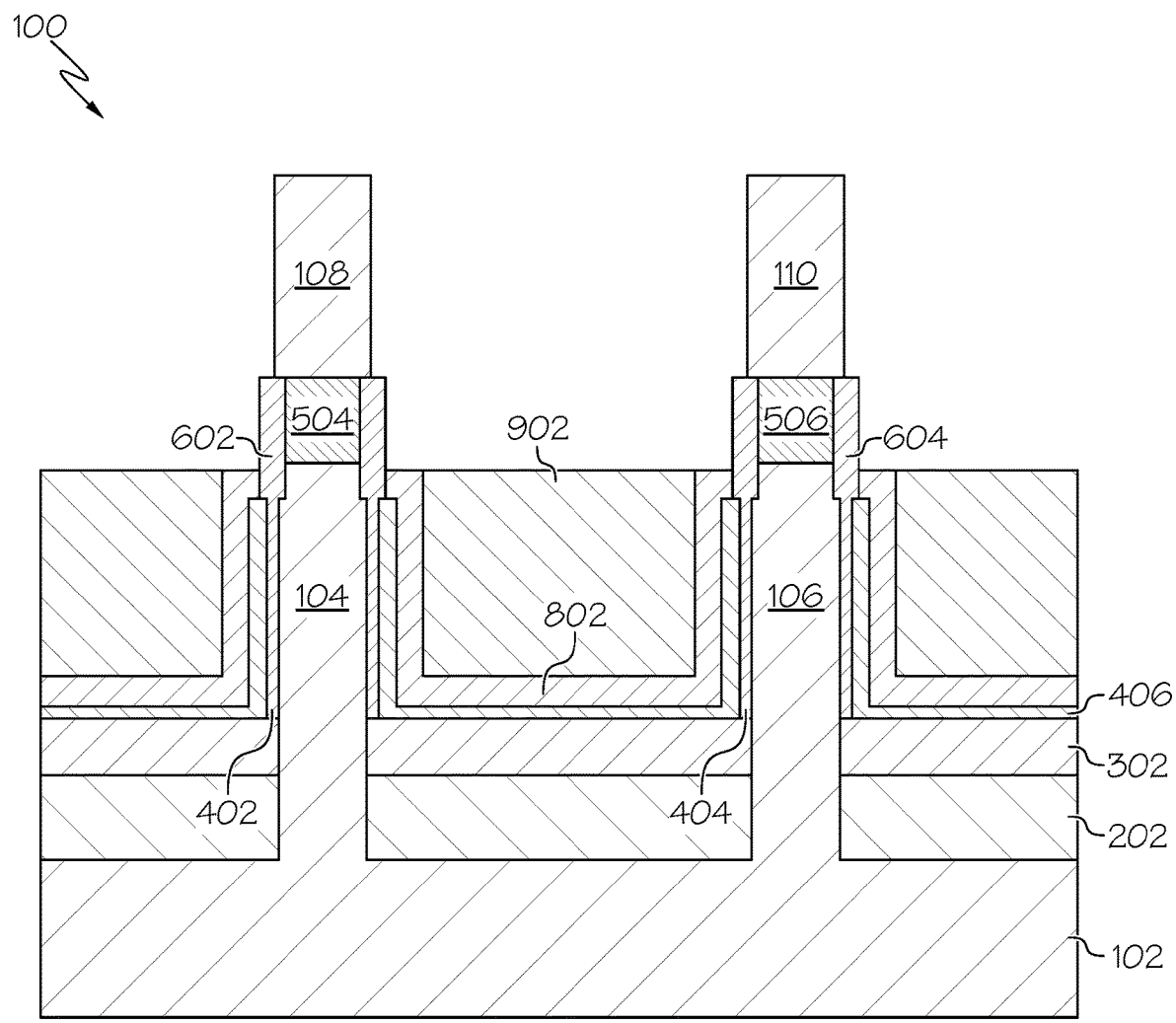
FIG. 9 is a cross-sectional view of the semiconductor structure after the one or more conductive gate layers have been recessed according one embodiment of the present disclosure.

A second OPL 902 is then deposited over the entire structure and recessed, as shown in FIG. 9. The second OPL 902 may be recessed utilizing nitrogen or hydrogen plasma. In one embodiment, the second OPL 902 is recessed to a height that is between a top surface of the chemical oxide layers 602, 604 and above a bottom surface of the chemical oxide layers 602, 604. A wet chemistry etch may then be used to etch the conductive gate layer 802 such that the top surface of the conductive gate layer 802 is coplanar with the top surface of the second OPL 902. This process exposes a portion of the chemical oxide layers 602, 604 and also exposes the hard masks 108, 110. The interfacial layers 402, 404 and the insulating layer 406 are encapsulated (wrapped around) by the conductive gate layer 802. The encapsulation prevents the interfacial layers 402, 404 and the insulating layer 406 from being damaged during formation of a top spacer.

Figure 10:
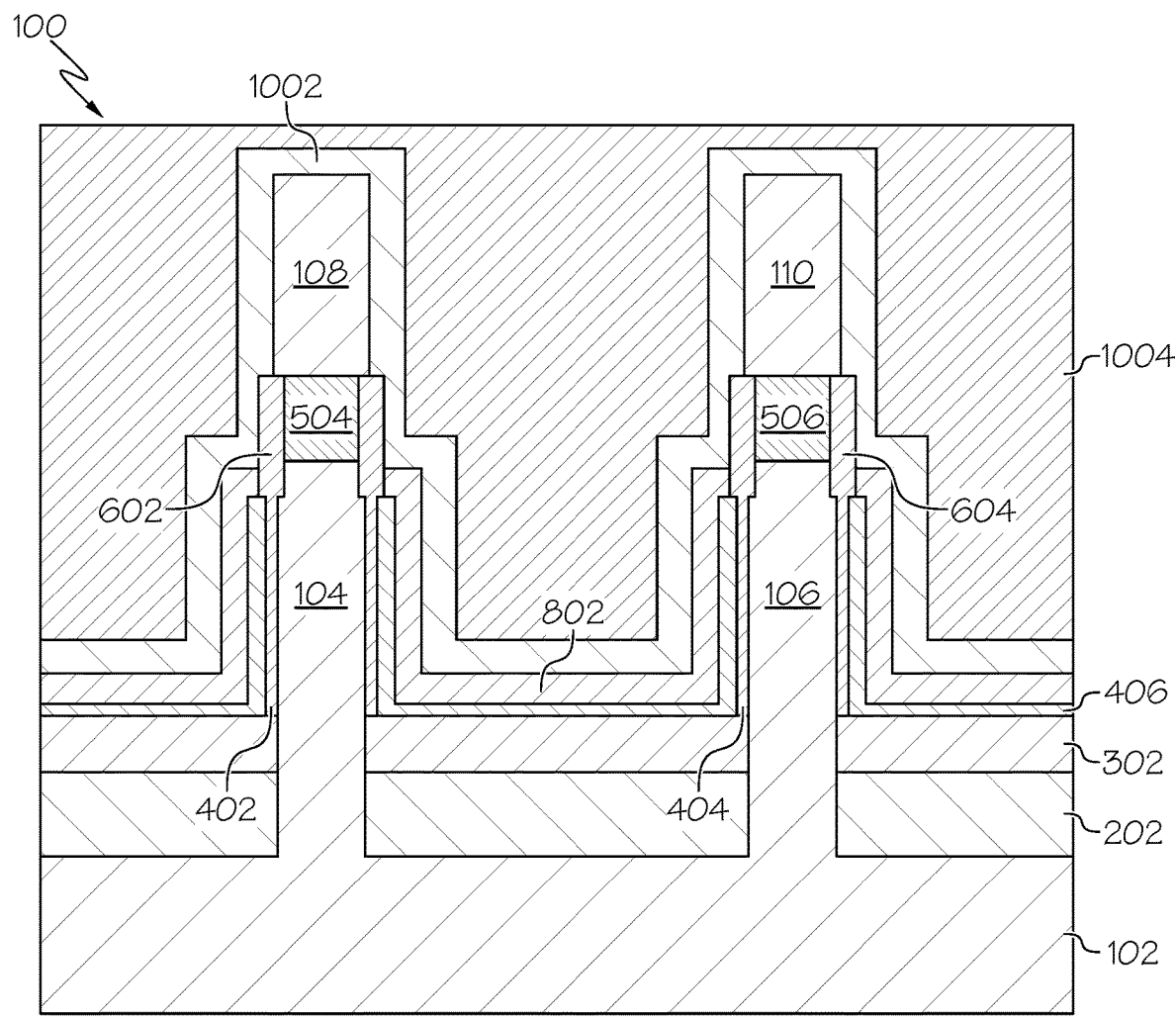
FIG. 10 is a cross-sectional view of the semiconductor structure after a top spacer layer has been formed according one embodiment of the present disclosure.
Figure 11:
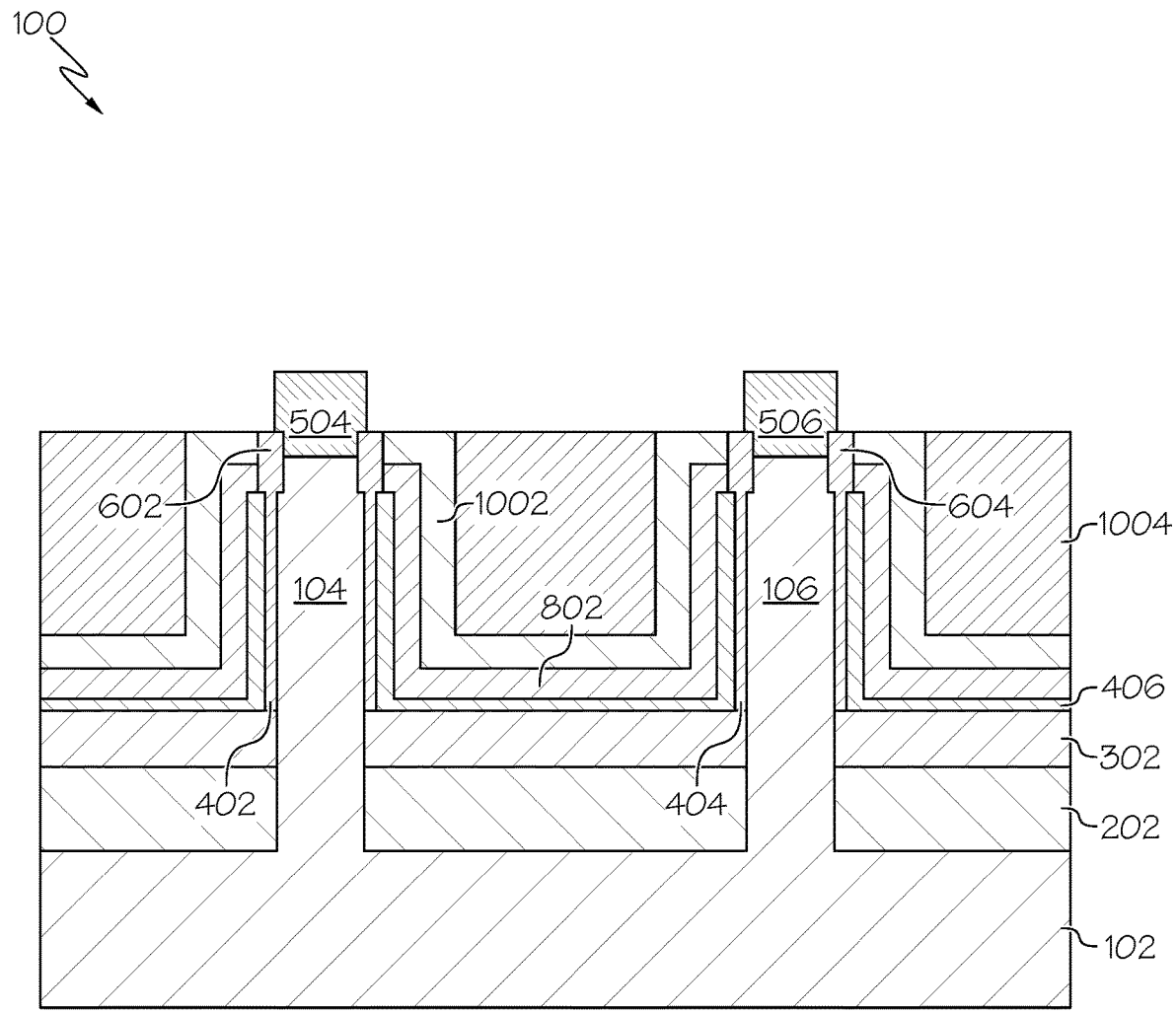
FIG. 11 is a cross-sectional view of the semiconductor structure after top spacer layer has been recessed according one embodiment of the present disclosure.

After the conductive gate layer 802 has been recessed, the second OPL 902 may be removed using nitrogen or hydrogen plasma. Then, a conformal protective liner 1002 such as (but not limited to) silicon nitride is formed over the structure as shown in FIG. 10. In one embodiment, the protective liner 1002 acts as a top spacer layer. After the protective liner 1002 is formed, an inter-layer dielectric (ILD) layer 1004 is deposited on and in contact with the protective liner 1002. One or more recessing operations are performed to recess the ILD layer 1004 down to a desired height. In one embodiment, the ILD layer 1004 is recessed to a height between the top surface of the junctions 504, 506 and the bottom surface of the junctions 504, 506. The hard masks 108, 110 and protective liner 1002 are selectively removed by, for example, RIE which stops on the fin structures 104, 106. After the above processes are performed, the top surfaces of the protective liner 1002, ILD 1004, and oxide layers 602, 604 are co-planar, as shown in FIG. 11. FIG. 11 further shows that at least a portion of the junctions 504, 506 extend above the top surface of the liner 1002, ILD 1004, and oxide layers 602, 604 for epitaxial growth of top source/drains.

Top source/drains 1202, 1204 are then formed in contact with at least the top source/drain junctions 504, 506. The source/drains 1202, 1204 may be formed using an epitaxy process. For example, selective epitaxy may be used to grow material from the exposed top source/drain junctions 504, 506 to form the top source/drain layers 1202, 1204. The top source/drain layers 1202, 1204 may comprise in-situ doping (boron, in one embodiment for PFET and phosphorus, in one embodiment, for NFET). It should be noted that, according to one embodiment, the top source/drain layers 1202, 1204 may not contain any doping. Doping may be performed using any standard approach such as ion implantation. In particular, due to the slower growth rates on (111) orientated surface during the epitaxial growth so that faceted top source/drain layers 1202, 1204 are obtained. As shown in FIG. 12, the top source/drain layers 1202, 1204 comprise angled sides. In some embodiments, the top/source drain layers 1202, 1204 comprise a diamond shape. The epitaxial growth of diamond shaped epitaxy is self-limiting to the outer <111> plane resulting in diamond outer periphery. It should be noted that, non-faceted epitaxy and/or multiple epitaxy steps can be used to form the top source/drain layers 1202, 1204 without limiting the scope of the present disclosure. It should also be noted that, in some embodiments, the top/source drain layers 1202, 1204 may be merged.

Figure 13:
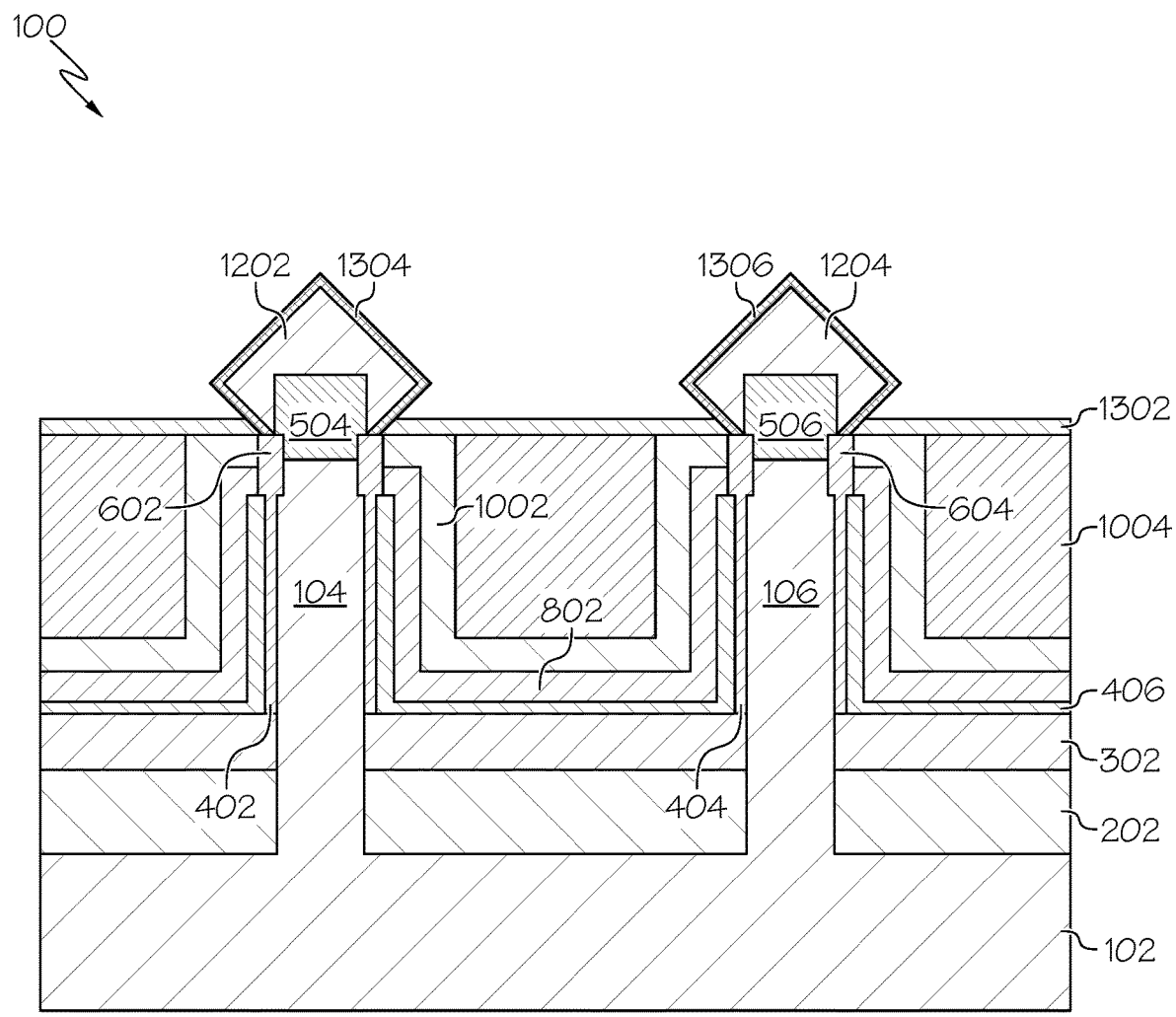
FIG. 13 is a cross-sectional view of the semiconductor structure after silicide has been formed on the top source/drain layers according one embodiment of the present disclosure.

FIG. 13 shows that after the source/drains 1202, 1204 are formed an additional liner 1302 comprising, for example, silicon nitride is formed in contact with at least the top surface of the protective liner 1002 and the top surface of the ILD 1004. This liner acts as an etch stop when forming a contact trench. FIG. 13 further shows that silicide 1304, 1306 is formed in contact with the top source/drain layers 1202, 1204. For example, a metal is deposited on top and in contact with exposed portions of the top source/drain layers 1202, 1204. An anneal is then performed to form silicides from the deposited metal and a portion of the top source/drain layers 1202, 1204. Unreacted metal is then selectively removed. The metal, in one example, includes cobalt, tungsten, nickel, titanium, platinum, or an alloy or combination thereof. However, other materials are applicable a well. The silicide regions 1304, 1306 improve source/drain resistance.

Figure 14:
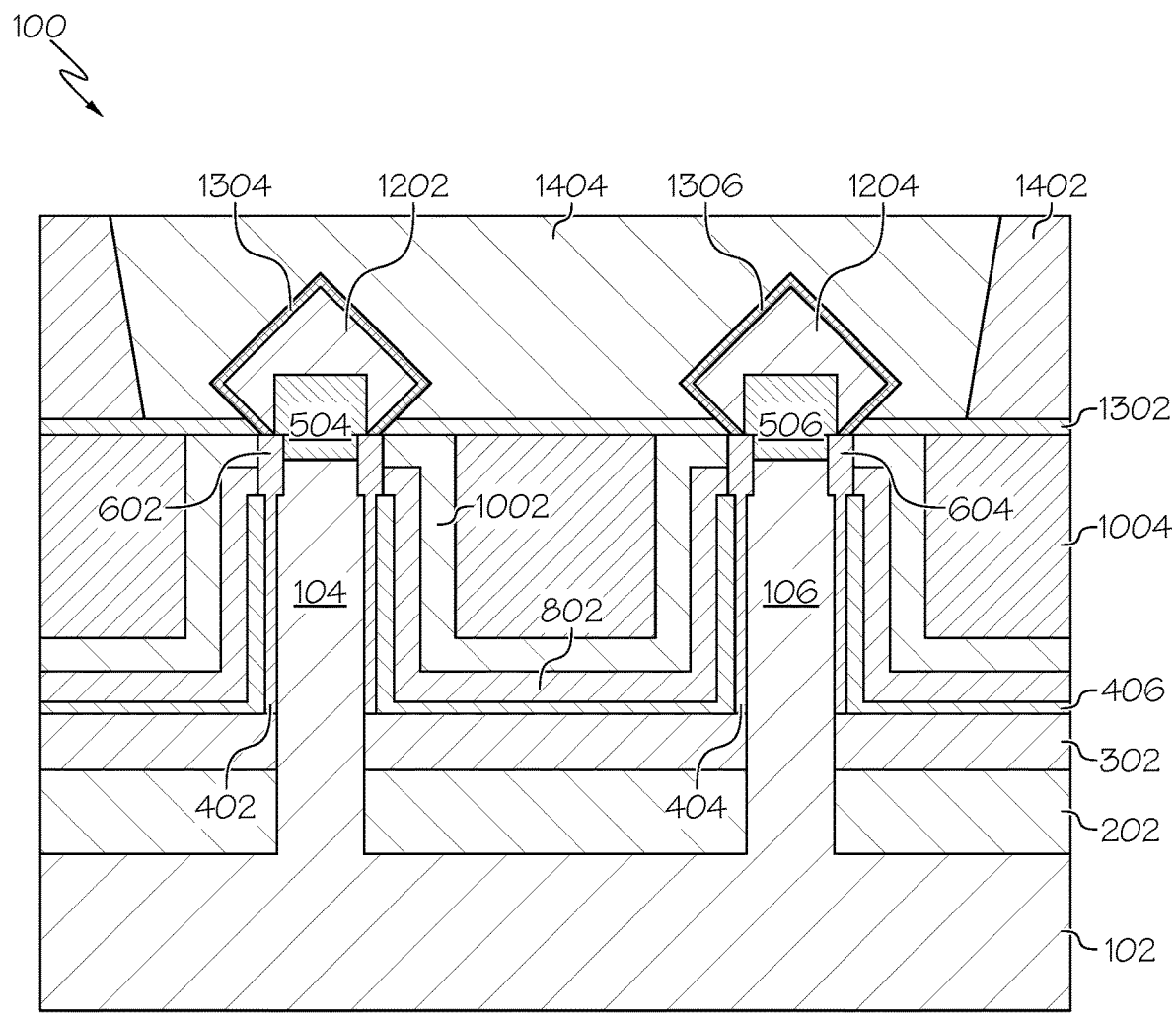
FIG. 14 is a cross-sectional view of the semiconductor structure after contact metal/metallic layers have been formed according one embodiment of the present disclosure.

A dielectric layer 1402 is then formed over the entire structure, as shown in FIG. 14. The dielectric layer 1402, in one embodiment, includes SiO2, Si3N4, SiOxNy, SiC, SiCO, SiCOH, and SiCH compounds; one or more silicon-based materials with some or all of the Si replaced by Ge; carbon-doped oxides; inorganic oxides; inorganic polymers; hybrid polymers; organic polymers such as polyamides or SiLK™; other carbon-base materials; organo-inorganic materials such as spin-on glasses and silsesquioxane-based materials; and diamond-like carbon (DLC, also known as amorphous hydrogenated carbon, α-C:H). Additional choices for the blanket dielectric include any of the aforementioned materials in porous form, or in a form that changes during processing to or from being porous and/or permeable to being non-porous and/or non-permeable.

The dielectric layer 1402 is then patterned and etched to form one or more contact openings/trenches down to the liner 1302 and exposing the top source/drain layers 1202, 1204. One or more contact metal/metallic layers 1404 are then formed within the contact opening(s). The contact metal/metallic layers 1404 may fill the contact opening(s) and contact the top surface of the liner 1302 and the silicide 1304, 1306 of the top source/drain layers 1202, 1204. The contact metal layer(s) 1404, in one embodiment, comprises tungsten (W), titanium (Ti), tantalum (Ta), TiN, hafnium (Hf), zirconium (Zr), niobium (Nb), or alloys comprising carbon. However, other materials are applicable as well.

Figure 15:
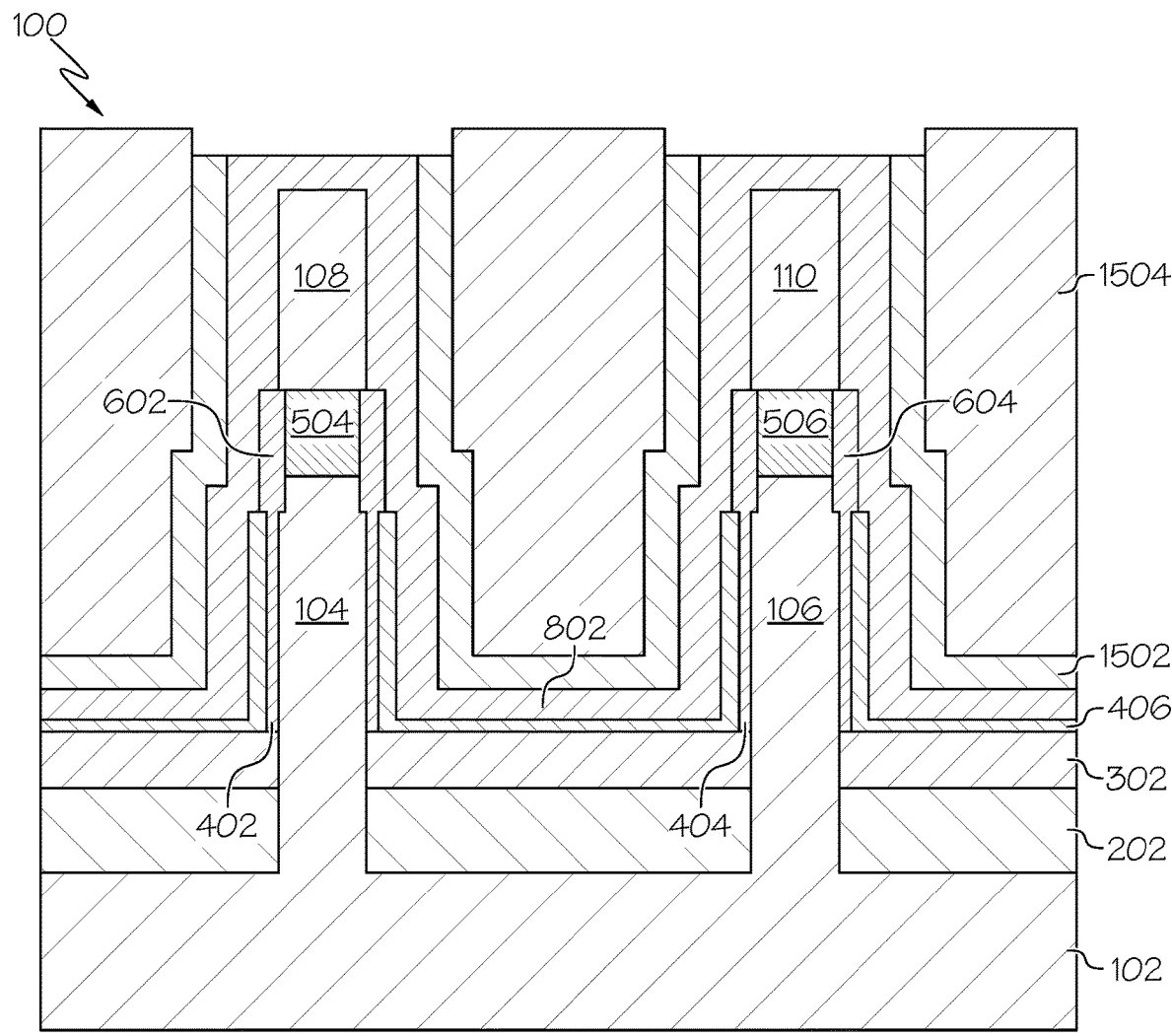
FIG. 15 is a cross-sectional view of a semiconductor structure after a top spacer layer has been formed over and in contact with the one or more gate conductive layers of FIG. 8 and then subsequently recessed according one embodiment of the present disclosure.

FIGS. 15-18 illustrate a late gate recess embodiment. Typically, dense fin regions and isolated regions have a large process difference referred to as "micro-loading effects". However, the embodiments shown in FIGS. 15-18 have less micro-loading effects since all fins (or vertical FET) are surrounded by a protective liner, which leads to the uniform control of gate recess regardless of fin density. FIG. 15 shows that after the one or more conductive gate layer(s) 802 are formed a protective liner/layer 1502 comprising, for example, silicon nitride is formed in contact with and conforming to the conductive gate layer 802. After the protective liner 1502 is formed, an inter-layer dielectric (ILD) layer 1504 is deposited over the entire structure and polished down such that the top surface of the ILD 1504 is coplanar with the top surface of the protective liner 1502. An etching process such as RIE is then performed to remove the top portion of the protective liner 1502. This exposes a top surface of the conductive gate layer 802.

Figure 16:
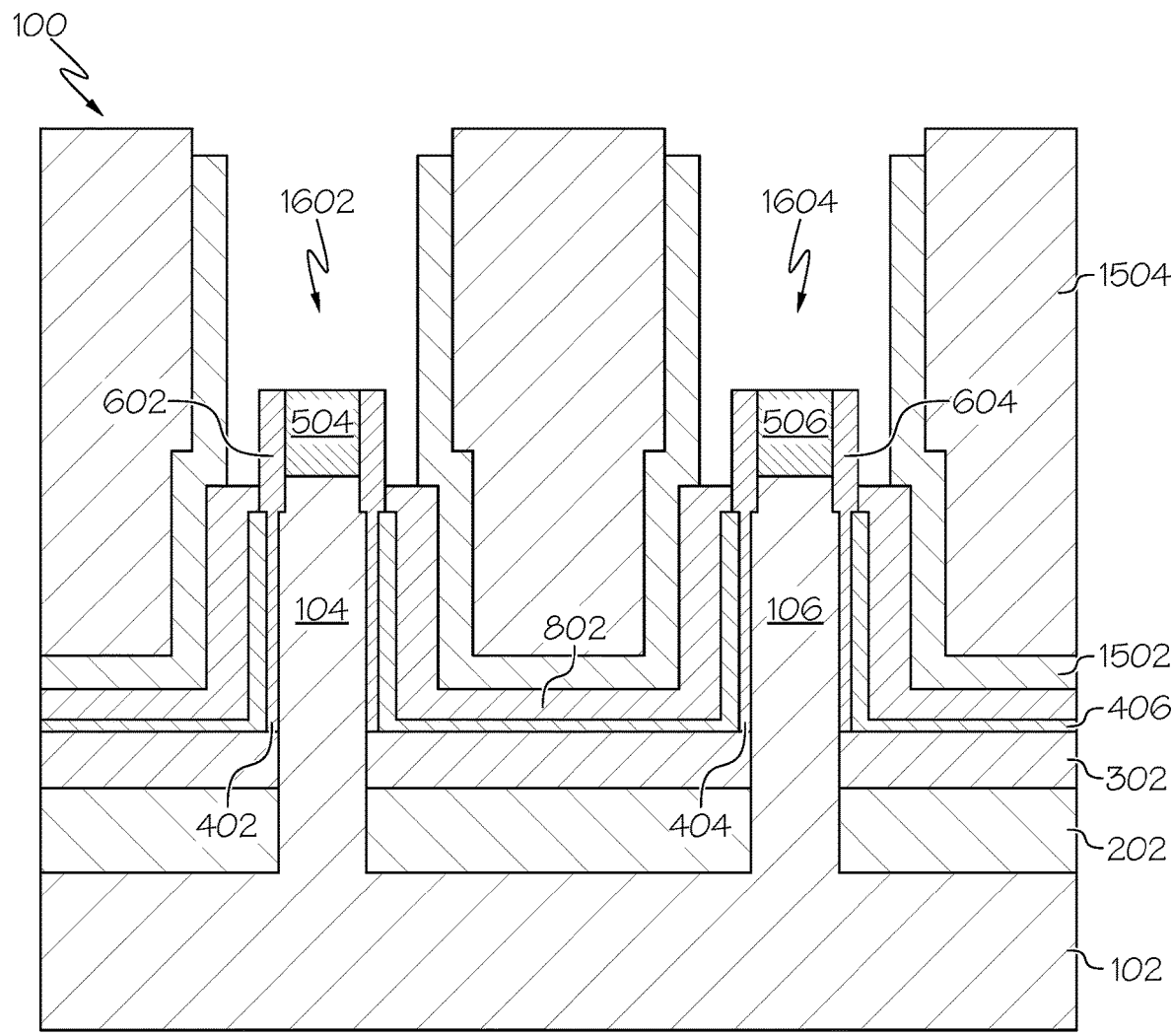
FIG. 16 is a cross-sectional view of the semiconductor structure after the one or more gate conductive layers have been recessed according one embodiment of the present disclosure.

FIG. 16 shows that after removal of top portion of the conductive gate layer 802 one or more etching processes are then performed to remove the hard masks 108, 110 and recess the conductive gate layer 802 for each fin 104, 106. This process forms a cavity/trench 1602, 1604 in place of the hard masks 108, 110 and recessed portions of the conductive gate layer 802. A wet chemistry etch may be used to etch the conductive gate layer 802 such that it is recessed down below a top surface of the chemical oxide layers 602, 604 (or top source/drain junctions 504, 506) and above a bottom surface of the chemical oxide layers 602, 604 (or top source/drain junctions 504, 506). The etching process in this embodiment, does not affect the protective liner 1502.

Figure 17:
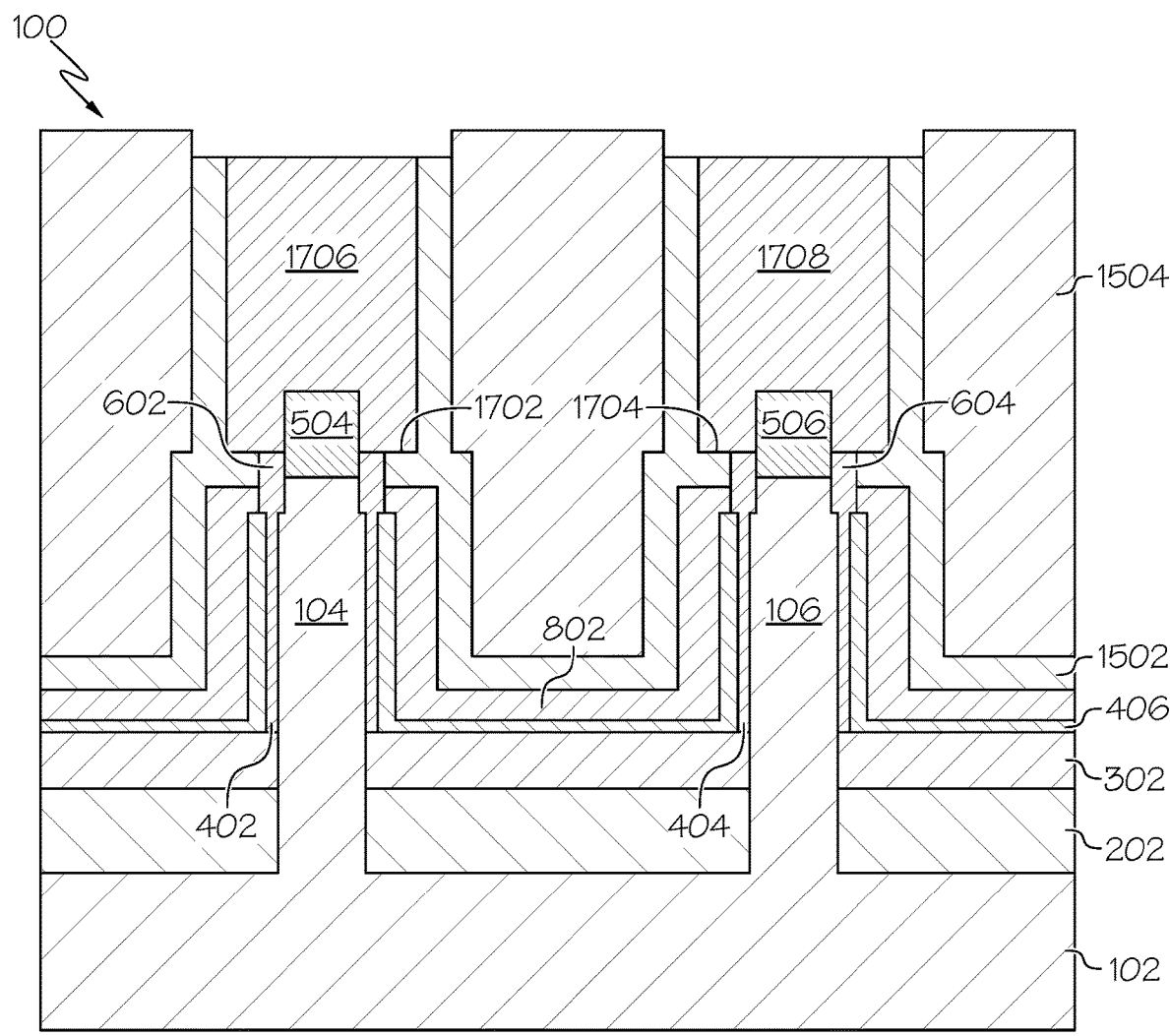
FIG. 17 is a cross-sectional view of the semiconductor structure after top source/drain layers have been formed according one embodiment of the present disclosure.

FIG. 17 shows that top spacer 1702, 1704 comprising, for example, silicon nitride may be formed in contact with the exposed top surface of the conductive gate layer 802; sidewall portions of the chemical oxide layers 602, 604; and a portion of the protective liner inner sidewalls. In one embodiment, high density plasma may be used to deposit the top spacer 1702, 1704. The oxide layers 602, 604 are recessed down to the top surface of the top spacer 1702, 1704. Top source/drains 1706, 1708 are then formed within the cavities 1602, 1604 and in contact with the junctions 504, 506 which are extending above the oxide layers 602, 604. The top source/drains 1706, 1708 may be either a source or a drain and contact the exposed inner sidewalls of the protective liner 1502; the top surface of the top spacer 1702, 1704; the top source/drain junctions 504, 506; and the chemical oxide layers 602, 604.

The top source/drains 1706, 1708 may be formed using an epitaxy process. For example, selective epitaxy may be used to grow material from the exposed top source/drain junctions 504, 506 to form the top source/drain layers 1706, 1708. The top source/drain layers 1706, 1708 may comprise in-situ doping (boron, in one embodiment for PFET and phosphorus, in one embodiment, for NFET). It should be noted that, according to one embodiment, the top source/drain layers 1706, 1708 may not contain any doping. Doping may be performed using any standard approach such as ion implantation. Conventional processes may then be performed to complete the device(s).

Figure 18:
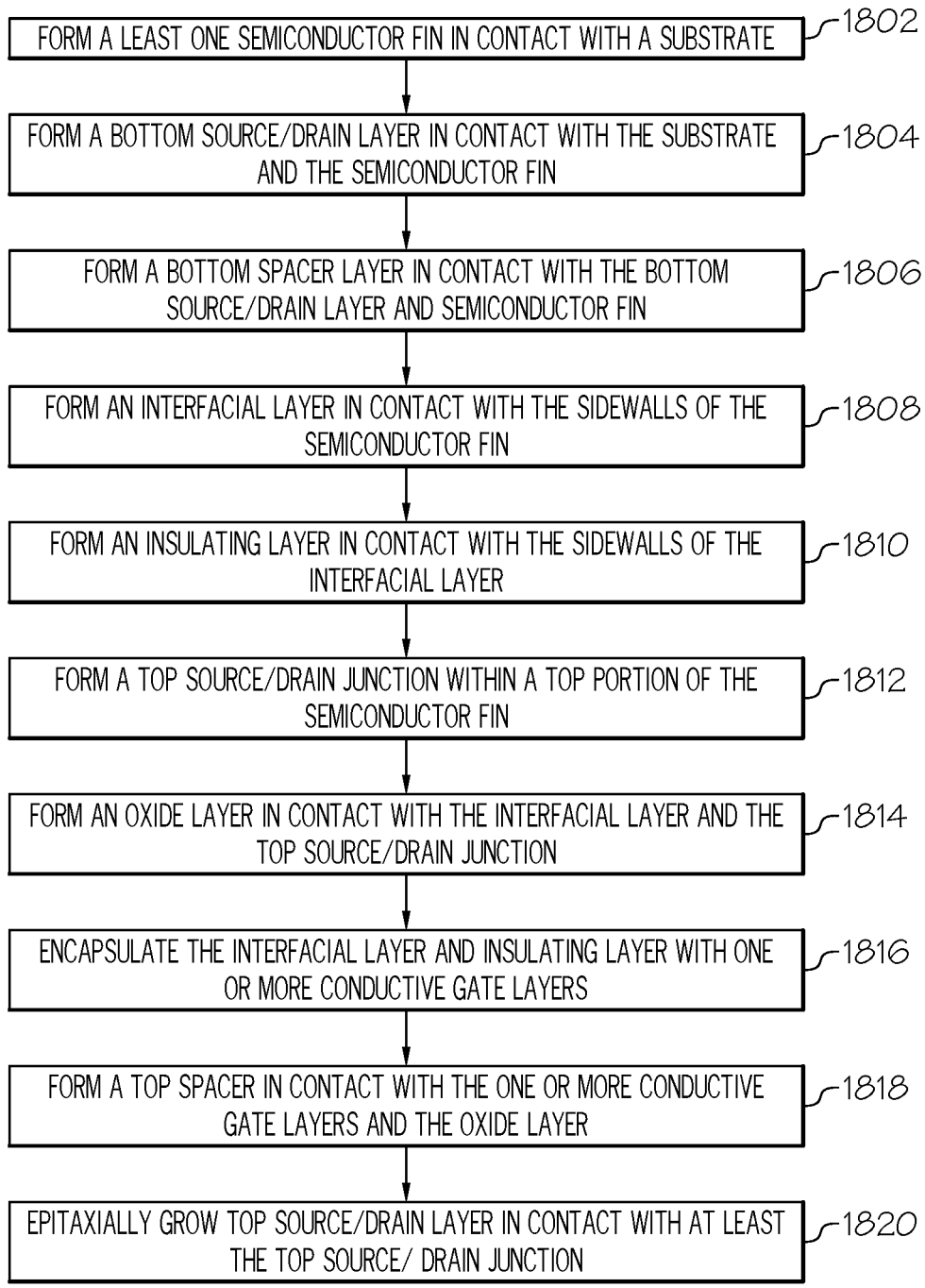
FIG. 18 is an operational flow diagram illustrating one example of a process forming a vertical FET semiconductor structure having improved gate stack reliability according one embodiment of the present disclosure.

FIG. 18 is an operational flow diagram illustrating one example of a process for forming a vertical FET semiconductor structure having improved gate stack reliability according to one embodiment of the present disclosure. It should be noted that each of the steps shown in FIG. 18 has been discussed in greater detail above with respect to FIGS. 1 to 14. A least one semiconductor fin, at step 1802, is formed in contact with a substrate. A bottom source/drain layer, at step 1804, is then formed in contact with the substrate and the semiconductor fin. A bottom spacer layer, at step 1806, is formed in contact with the bottom source/drain layer and semiconductor fin. An interfacial layer, at step 1808, is then formed in contact with the sidewalls of the semiconductor fin. An insulating layer, at step 1810, is formed in contact with the sidewalls of the interfacial layer.

A top source/drain junction, at step 1812, is formed within a top portion of the semiconductor fin. An oxide layer, at step 1814, is formed in contact with the interfacial layer and the top source/drain junction. The interfacial layer and insulating layer, at step 1816, are encapsulated with one or more conductive gate layers. A top spacer, at step 1818, is formed in contact with the one or more conductive gate layers and the oxide layer. A top source/drain layer, at step 1820, is epitaxially formed in contact with at least the top source/drain junction.

Figure 19:
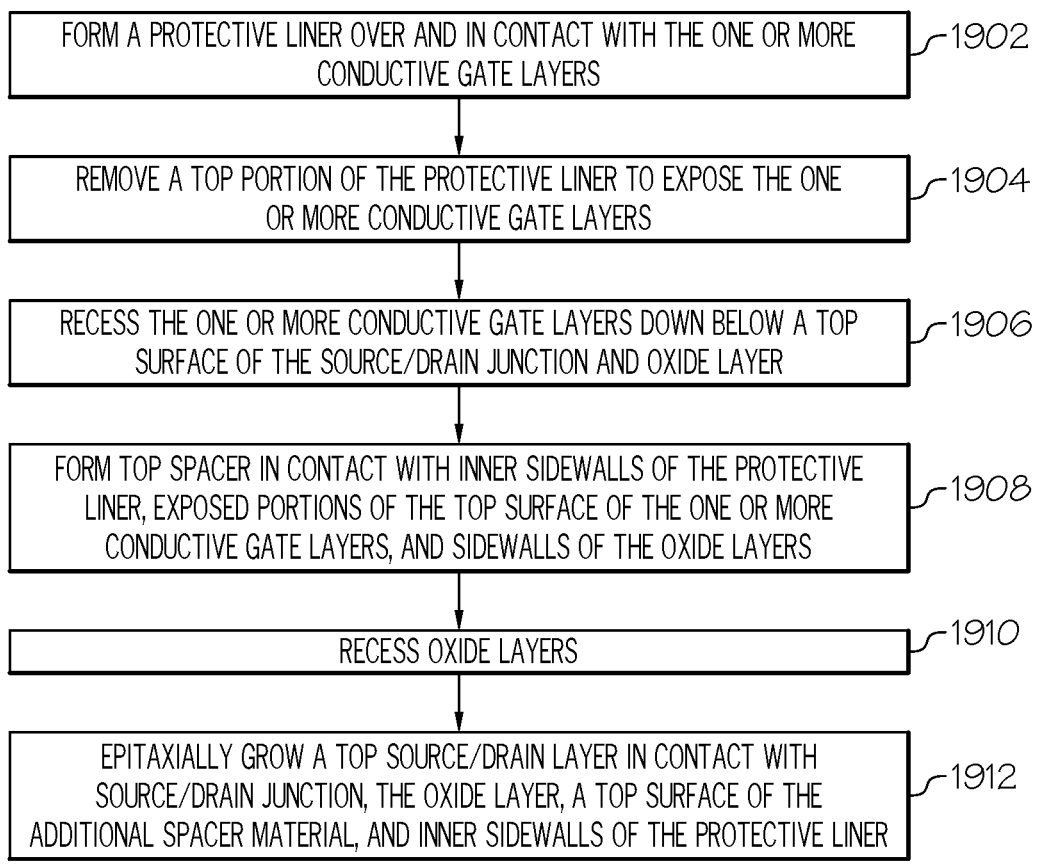
FIG. 19 is an operational flow diagram illustrating one example of another process forming a vertical FET semiconductor structure having improved gate stack reliability according one embodiment of the present disclosure.

FIG. 19 is an operational flow diagram illustrating another example of a process for forming a vertical FET semiconductor structure having improved gate stack reliability according to one embodiment of the present disclosure. It should be noted that each of the steps shown in FIG. 19 has been discussed in greater detail above with respect to FIGS. 15 to 17. The operational flow of FIG. 19 may begin after step 1816 of FIG. 18. A protective liner, at step 1902, is formed over and in contact with the one or more conductive gate layers. A top portion of the protective liner, at step 1904, is removed to expose the one or more conductive gate layers. The one or more conductive gate layers, at step 1906, are recessed down below a top surface of the source/drain junction and oxide layer. This creates a cavity exposing inner sidewalls of the protective liner. A top spacer, at step 1908, is formed in contact with inner sidewalls of the protective liner, exposed portions of the top surface of the one or more conductive gate layers, and sidewalls of the oxide layers. The oxide layers, at step 1910, are recessed down to the top surface of the top spacer. A top source/drain layer, at step 1912, is then epitaxially grown in contact with source/drain junction, the oxide layer, inner sidewalls of the protective liner, and a top surface of the top spacer.

Although specific embodiments have been disclosed, those having ordinary skill in the art will understand that changes can be made to the specific embodiments without departing from the spirit and scope of the disclosure. The scope of the disclosure is not to be restricted, therefore, to the specific embodiments, and it is intended that the appended claims cover any and all such applications, modifications, and embodiments within the scope of the present disclosure.

It should be noted that some features of the present disclosure may be used in one embodiment thereof without use of other features of the present disclosure. As such, the foregoing description should be considered as merely illustrative of the principles, teachings, examples, and exemplary embodiments of the present disclosure, and not a limitation thereof.

Also note that these embodiments are only examples of the many advantageous uses of the innovative teachings herein. In general, statements made in the specification of the present application do not necessarily limit any of the various claimed disclosures. Moreover, some statements may apply to some inventive features but not to others.

What is claimed is:

1. A method for forming a semiconductor structure, the method comprising at least:
   forming at least one semiconductor fin;
   forming a source/drain layer in contact with the semiconductor fin;
   forming an interfacial layer in contact with sidewalls of the semiconductor fin and above the source/drain layer;
   forming an insulating layer in contact with the interfacial layer; and
   encapsulating the interfacial layer and the insulating layer with one or more conductive gate layers.

2. The method of claim 1, further comprising:
   forming a source/drain junction within a top portion of the semiconductor fin; and forming an oxide layer above the interfacial layer and the insulating layer, and in contact with the source/drain junction.

3. The method of claim 2, wherein encapsulating the interfacial layer and the insulating layer with the one or more conductive gate layers comprises:
forming the one or more conductive gate layers over and in contact with at least the interfacial layer and the insulating layer; and
recessing the one or more conductive gate layers such that a top surface of the one or more conductive gate layers is below a top surface of the oxide layer and above a bottom surface of the oxide layer.

4. The method of claim 1, further comprising:
forming the source/drain layer in contact with a substrate and a portion of the semiconductor fin.

5. The method of claim 1, further comprising:
forming a spacer layer in contact with the source/drain layer and the semiconductor fin, wherein the interfacial layer and insulating layer are formed in contact with the spacer layer.

6. The method of claim 1, further comprising:
forming a first spacer layer in contact with the one or more conductive gate layers and an oxide layer formed in contact with a source/drain junction within the semiconductor fin, the first spacer layer being formed above a second spacer layer formed in contact with the semiconductor fin.

7. The method of claim 6, further comprising:
epitaxially forming an additional source/drain layer in contact with at least the source/drain junction, the additional source/drain layer being formed above the source/drain layer, wherein second spacer layer contacts the source/drain layer.

8. A semiconductor structure comprising at least:
at least one semiconductor fin;
a first source/drain in contact with the semiconductor fin;
an interfacial layer in contact with sidewalls of the semiconductor fin;
an insulating layer in contact with the interfacial layer;
one or more conductive gate layers encapsulating the interfacial and insulating layers; and
a second source/drain formed above the first source/drain.

9. The semiconductor structure of claim 8, further comprising
a first spacer layer in contact with at least the first source/drain and the semiconductor fin; and
a second spacer layer formed above the first spacer layer and in contact with at least the one or more conductive gate layers.

10. The semiconductor structure of claim 9, further comprising:
a dielectric layer in contact with the second spacer layer; and
an etch stop liner in contact with at least the dielectric layer and the second spacer.

11. The semiconductor structure of claim 8, further comprising:
a source/drain junction formed within the semiconductor fin and in contact with at least the second source/drain; and
an oxide layer in contact with sidewalls of the source/drain junction.

12. The semiconductor structure of claim 11, wherein the second source/drain is formed at least in contact with the source/drain junction.

13. The semiconductor structure of claim 11, wherein the oxide layer is wider than the interfacial layer.

14. The semiconductor structure of claim 8, wherein the second source/drain comprises one or more faceted regions.

15. A semiconductor structure comprising at least:
at least one semiconductor fin;
a first source/drain in contact with the semiconductor fin;
an interfacial layer in contact with sidewalls of the semiconductor fin;
an insulating layer in contact with the interfacial layer;
one or more conductive gate layers encapsulating the interfacial and insulating layers;
a protective layer in contact with and extending above at least the one or more conductive gate layers; and
a second source/drain formed above the first source/drain and in contact with at least inner sidewalls of the protective layer.

16. The semiconductor structure of claim 15, further comprising
a spacer layer in contact with at least the first source/drain and the semiconductor fin, wherein the spacer layer is formed below another spacer layer formed in contact with inner sidewalls of the protective layer.

17. The semiconductor structure of claim 15, further comprising:
a source/drain junction formed within the semiconductor fin and in contact with at least the second source/drain; and
an oxide layer in contact with sidewalls of the source/drain junction, wherein the source/drain junction and the oxide layer are situated between the inner sidewalls of the protective layer.

18. The semiconductor structure of claim 17, wherein the second source/drain further contacts the source/drain junction.

19. The semiconductor structure of claim 17, wherein the oxide layer is wider than the interfacial layer.

20. The semiconductor structure of claim 17, wherein the one or more conductive gate layers contact a top surface of the insulating layer and a sidewall of the oxide layer.

* * * * *